(12) United States Patent
Kawachi

(10) Patent No.: US 7,817,385 B2
(45) Date of Patent: Oct. 19, 2010

(54) SEMICONDUCTOR DEVICE INCLUDING ESD PROTECTION FIELD EFFECT TRANSISTOR WITH ADJUSTABLE BACK GATE POTENTIAL

(75) Inventor: Toshikatsu Kawachi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 631 days.

(21) Appl. No.: 11/806,270

(22) Filed: May 30, 2007

(65) Prior Publication Data

US 2007/0291429 A1 Dec. 20, 2007

(30) Foreign Application Priority Data

May 31, 2006 (JP) .............................. 2006-152351

(51) Int. Cl.
*H02H 3/22* (2006.01)
(52) U.S. Cl. ........................................ 361/56; 361/111
(58) Field of Classification Search .................... 361/56, 361/111

See application file for complete search history.

(56) References Cited

U.S. PATENT DOCUMENTS

| 6,011,681 | A | | 1/2000 | Ker et al. | |
|---|---|---|---|---|---|
| 6,075,686 | A | * | 6/2000 | Ker .............................. | 361/56 |
| 6,208,494 | B1 | * | 3/2001 | Nakura et al. .................. | 361/56 |
| 2004/0212936 | A1 | * | 10/2004 | Salling et al. .................. | 361/56 |

FOREIGN PATENT DOCUMENTS

JP 63-036557 2/1988

* cited by examiner

*Primary Examiner*—Danny Nguyen
(74) *Attorney, Agent, or Firm*—McGinn IP Law Group, PLLC

(57) ABSTRACT

In a semiconductor device including two circuit blocks, an ESD protection circuit between power supply terminals (or ground terminals) of the two circuit blocks having the same voltage level as each other is constructed by at least one diode-connected field effect transistor whose back gate potential is adjusted by a back gate potential adjusting circuit. As a result, the absolute value of the threshold voltage and the ON resistance of the ESD protection circuit can be changed in accordance with whether the operation mode is an ESD protection operation mode or a usual operation mode.

25 Claims, 18 Drawing Sheets

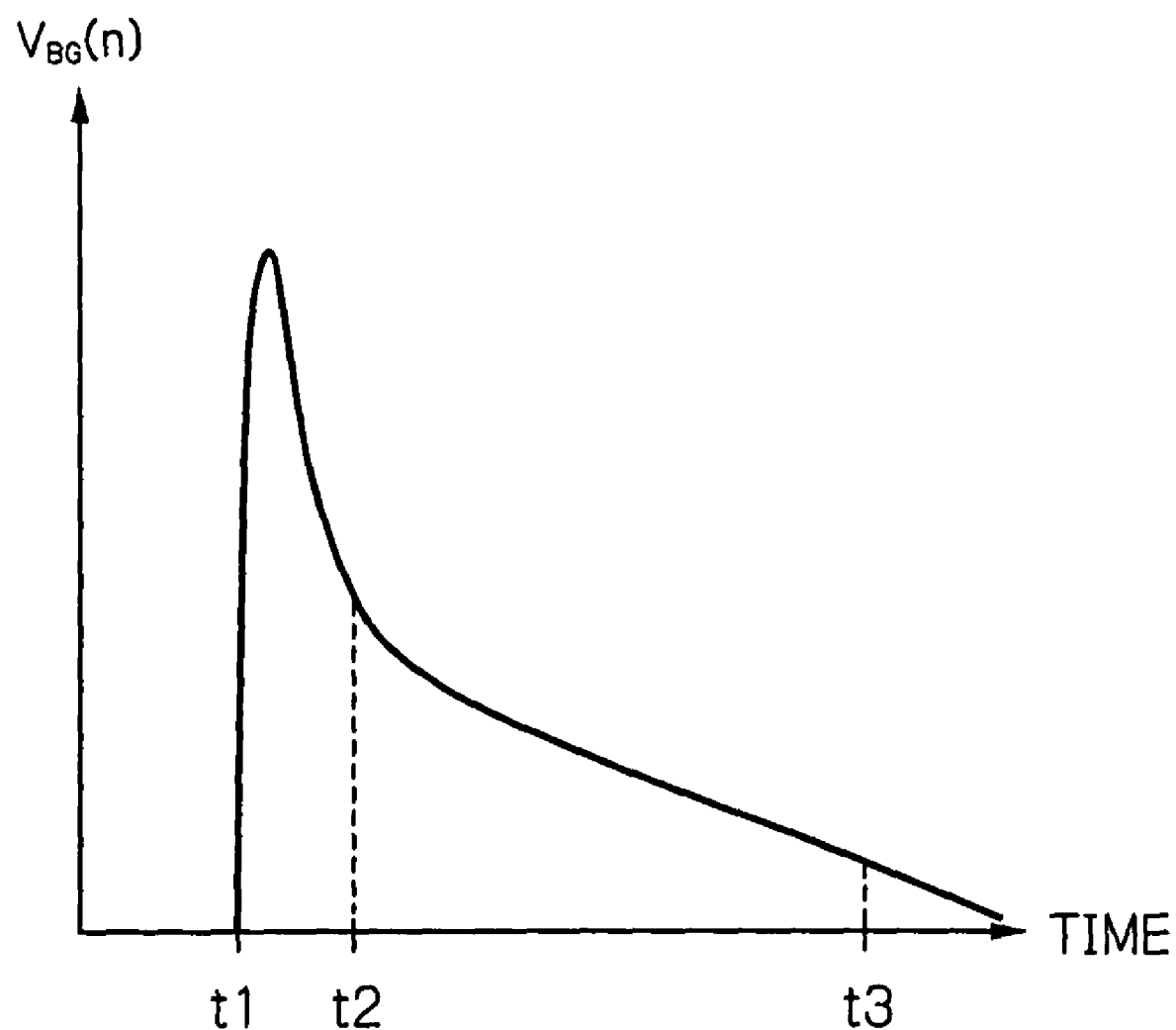

US 7,817,385 B2

SEMICONDUCTOR DEVICE INCLUDING ESD PROTECTION FIELD EFFECT TRANSISTOR WITH ADJUSTABLE BACK GATE POTENTIAL

BACKGROUND OF THE INVENTION

1. Field of the Invention

The present invention relates to a semiconductor device including an electrostatic discharge (ESD) protection circuit connected between power supply terminals (or ground terminals) of two circuit blocks having the same voltage level.

2. Description of the Related Art

As more separated circuit blocks such as analog circuits and digital circuits are integrated into a single semiconductor chip, the number of separated power supply terminals including separated ground terminals has been increased.

In each of the circuit blocks, an ESD protection diode is connected between the power supply terminal and the ground terminal for providing ESD current discharging paths.

On the other hand, bi-directional ESD protection diodes or silicon-controlled rectifier (SCR) circuits associated with field effect transistors or MOS transistors are connected between the power supply terminals (or the ground terminals) having the same voltage level of two of the circuit blocks for providing ESD current discharging paths (see: JP-63-036557A & U.S. Pat. No. 6,011,581). This will be explained later in detail.

SUMMARY OF THE INVENTION

In the above-described prior art semiconductor device, the field effect transistors or MOS transistors of the bi-directional ESD protection diodes or the associated MOS transistors of the silicon-controlled rectifier circuits always have definite threshold voltages and definite ON resistances regardless of an ESD protection operation mode and a usual operation mode. Generally, as the voltage at the power supply terminals has been decreased, the absolute values of the threshold voltages have been decreased and the ON resistances have been decreased, to effectively discharge electrostatic charges in an ESD protection mode. In this case, however, in a usual operation mode, it is difficult to completely turn OFF the bi-directional ESD protection diodes or silicon-controlled rectifier circuits.

According to the present invention, an ESD protection circuit between the power supply terminals (or the ground terminals) having the same voltage level of two circuit blocks as each other is constructed by at least one diode-connected field effect transistor whose back gate potential is adjusted by a back gate potential adjusting circuit. As a result, the absolute value of the threshold voltage and the ON resistance of the ESD protection circuit can be changed in accordance with whether the operation mode is an ESD protection operation mode or a usual operation mode.

BRIEF DESCRIPTION OF THE DRAWINGS

The present invention will be more clearly understood from the description set forth below, as compared with the prior art, with reference to the accompanying drawings, wherein:

FIG. 8 is a timing diagram for explaining the back gate potential of FIG. 7;

DESCRIPTION OF THE PREFERRED EMBODIMENTS

Before the description of the preferred embodiments, prior art semiconductor devices will be explained with reference to FIGS. 1 and 2.

Figure 1:
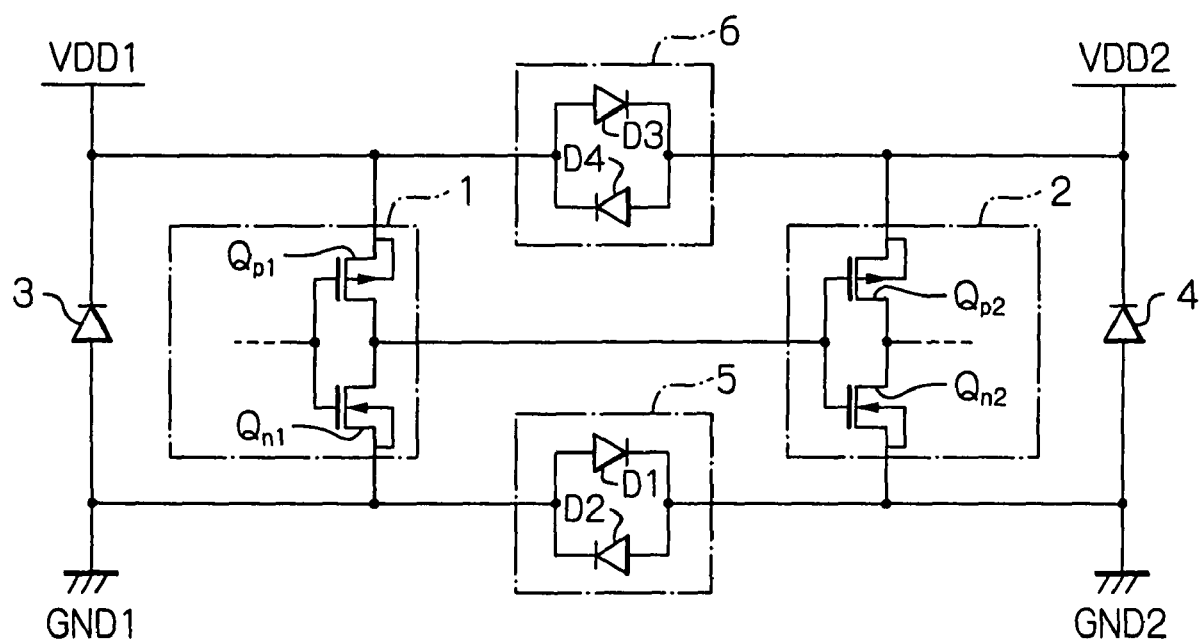
FIG. 1 is a circuit diagram illustrating a first prior art semiconductor device.

In FIG. 1, which illustrates a first prior art semiconductor device (see: FIG. 2 of JP-63-036557A), a circuit block 1 powered by a ground voltage at a ground terminal GND1 and a power supply voltage at a power supply terminal VDD1 and a circuit block 2 powered by a ground voltage at a ground terminal GND2 and a power supply voltage at a power supply terminal VDD2 are formed on a single semiconductor substrate (not shown). Note that the ground voltages at the ground terminals GND1 and GND2 have the same voltage level such as 0V, and the power supply voltages at the power supply terminals VDD1 and VDD2 have the same voltage level such as 3.3V, different from that at the ground terminals GND1 and GND2.

The circuit block 1 includes an output buffer formed by a p-channel field effect transistor or MOS transistor $Q_{p1}$ and an n-channel field effect transistor or MOS transistor $Q_{n1}$ connected in series between the power supply terminal VDD1 and the ground terminals GND1.

On the other hand, the circuit block 2 includes an input buffer formed by a p-channel field effect transistor or MOS transistor $Q_{p2}$ and an n-channel field effect transistor or MOS transistor $Q_{n2}$ connected in series between the power supply terminal VDD2 and the ground terminals GND2.

The output buffer ($Q_{p1}$, $Q_{n1}$) of the circuit block 1 is connected to the input buffer ($Q_{p2}$, $Q_{n2}$) of the circuit block 2. That is, in a usual operation mode, the output buffer ($Q_{p1}$, $Q_{n1}$) of the circuit block 1 is operated to generate an output signal which is supplied to the input buffer ($Q_{p2}$, $Q_{n2}$) of the circuit block 2.

Also, an ESD protection circuit 3 firmed by a diode-connected field effect transistor or MOS transistor is connected between the ground terminal GND1 and the power supply terminal VDD1, and an ESD protection circuit 4 formed by a diode-connected field effect transistor or MOS transistor is connected between the ground terminal GND2 and the power supply terminal VDD2.

Further, a bi-directional ESD diode circuit 5 is connected between the ground terminals GND1 and GND2. The bi-directional ESD diode circuit 5 is constructed by a diode D1 including a diode-connected field effect transistor or MOS transistor where a gate and one of a source and a drain are connected to the ground terminal GND1 and the other of the source and the drain is connected to the ground terminal GND2 and a diode D2 including a diode-connected field effect transistor or MOS transistor where a gate and one of a source and a drain to the ground terminal GND2 and the other of the source and the drain is connected to the ground terminal GND1.

Similarly, a bi-directional ESD diode circuit 6 is connected between the power supply terminals VDD1 and VDD2. The bi-directional ESD diode circuit 6 is constructed by a diode D3 including a diode-connected field effect transistor or MOS transistor where a gate and one of a source and a drain to the power supply terminal VDD1 and the other of the source and the drain is connected to the power supply terminal VDD2 and a diode D4 including a diode-connected field effect transistor or MOS transistor where a gate and one of a source and a drain are connected to the power supply terminal VDD2 and the other of the source and the drain is connected to the power supply terminal VDD1.

In the semiconductor device of FIG. 1, however, as the voltage at the power supply terminals VDD1 and VDD2 has recently been decreased, the absolute values of the threshold voltages of the diodes D1, D2, D3 and D4 have been decreased and the ON resistances of the diodes D1, D2, D3 and D4 have been decreased. As a result, it is difficult to completely turn OFF the diodes D1, D2, D3 and D4 in a usual operation mode.

Figure 2:
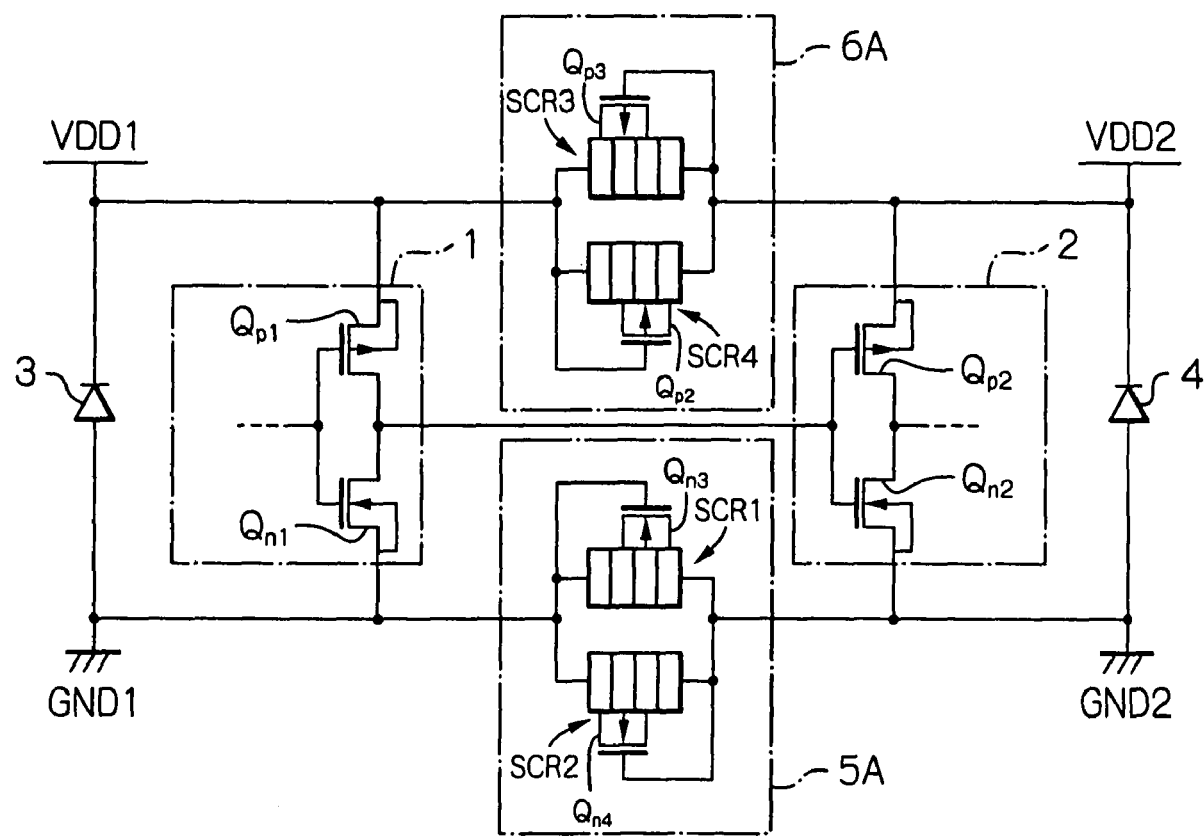
FIG. 2 is a circuit diagram illustrating a second prior art semiconductor device.
Figure 7:
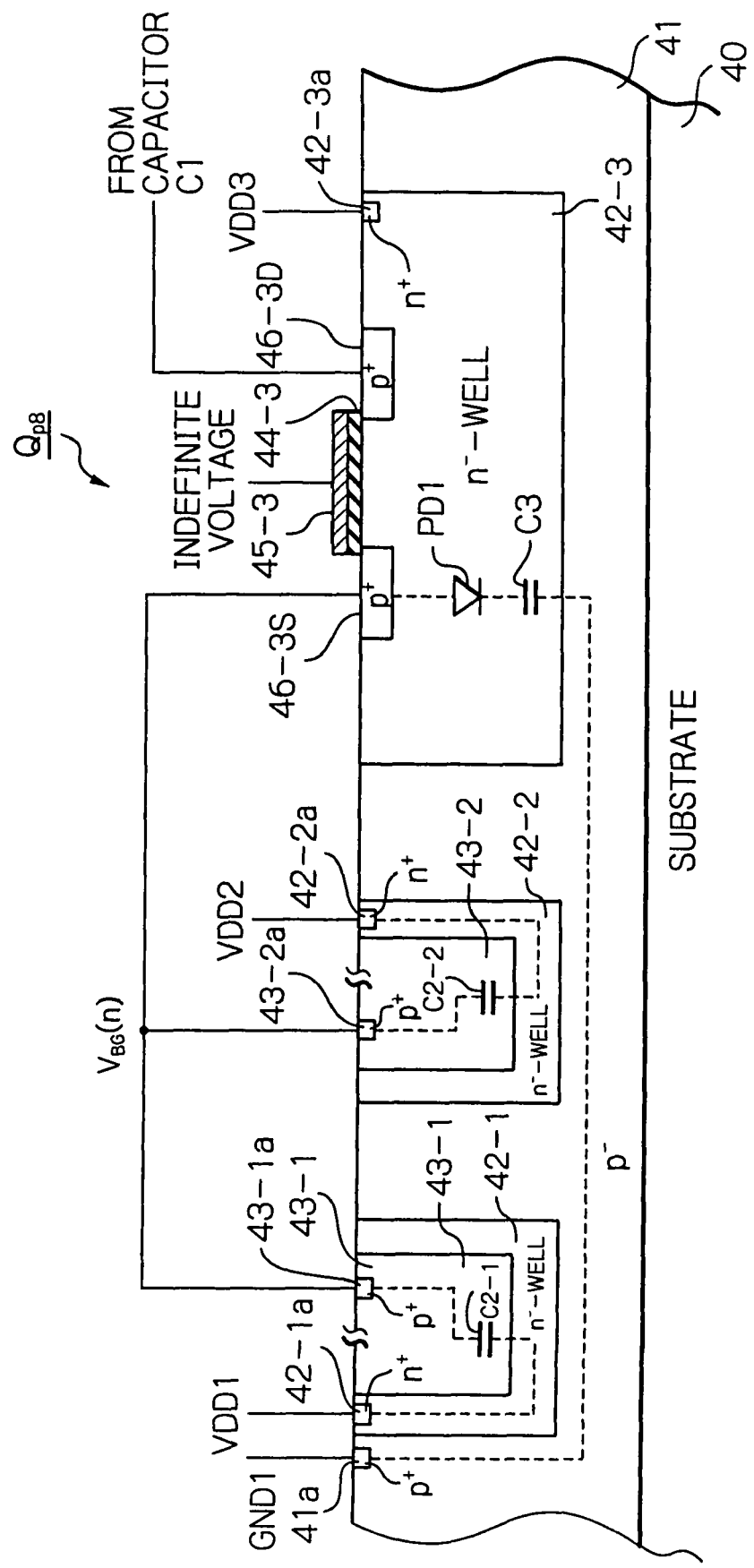
FIG. 7 is a cross-sectional view of the back gate potential adjusting circuit of FIG. 3.

In FIG. 2, which illustrates a second prior art semiconductor device (see: FIG. 7 of U.S. Pat. No. 6,011,681), the bi-directional ESD diode circuits 5 and 6 of FIG. 1 are replaced by bi-directional ESD silicon-controlled rectifier (SCR) circuits 5A and 6A, respectively.

The bi-directional ESD silicon-controlled rectifier circuit 5A is constructed by a silicon-controlled rectifier SCR1 associated with an n-channel field effect transistor or MOS transistor $Q_{n3}$ and a silicon-controlled rectifier SCR2 associated with an n-channel field effect transistor or MOS transistor $Q_{n4}$.

On the other hand, the bi-directional ESD silicon-controlled rectifier circuit 6A is constructed by a silicon-controlled rectifier SCR3 associated with a p-channel field effect transistor or MOS transistor $Q_{p3}$ and a silicon-controlled rectifier SCR4 associated with a p-channel field effect transistor or MOS transistor $Q_{p4}$.

Even in the semiconductor device of FIG. 2, as the voltage at the power supply terminals VDD1 and VDD2 has recently been decreased, the absolute values of the threshold voltages of the associated MOS transistors $Q_{n3}$, $Q_{n4}$, $Q_{p3}$, and $Q_{p4}$ have been decreased and the ON resistances of the associated MOS transistors $Q_{n3}$, $Q_{n4}$, $Q_{p3}$ and $Q_{p4}$ have been decreased. As a result, it is difficult to completely turn OFF the associated MOS transistors $Q_{n3}$, $Q_{n4}$, $Q_{p3}$ and $Q_{p4}$ in a usual operation mode.

Figure 3:
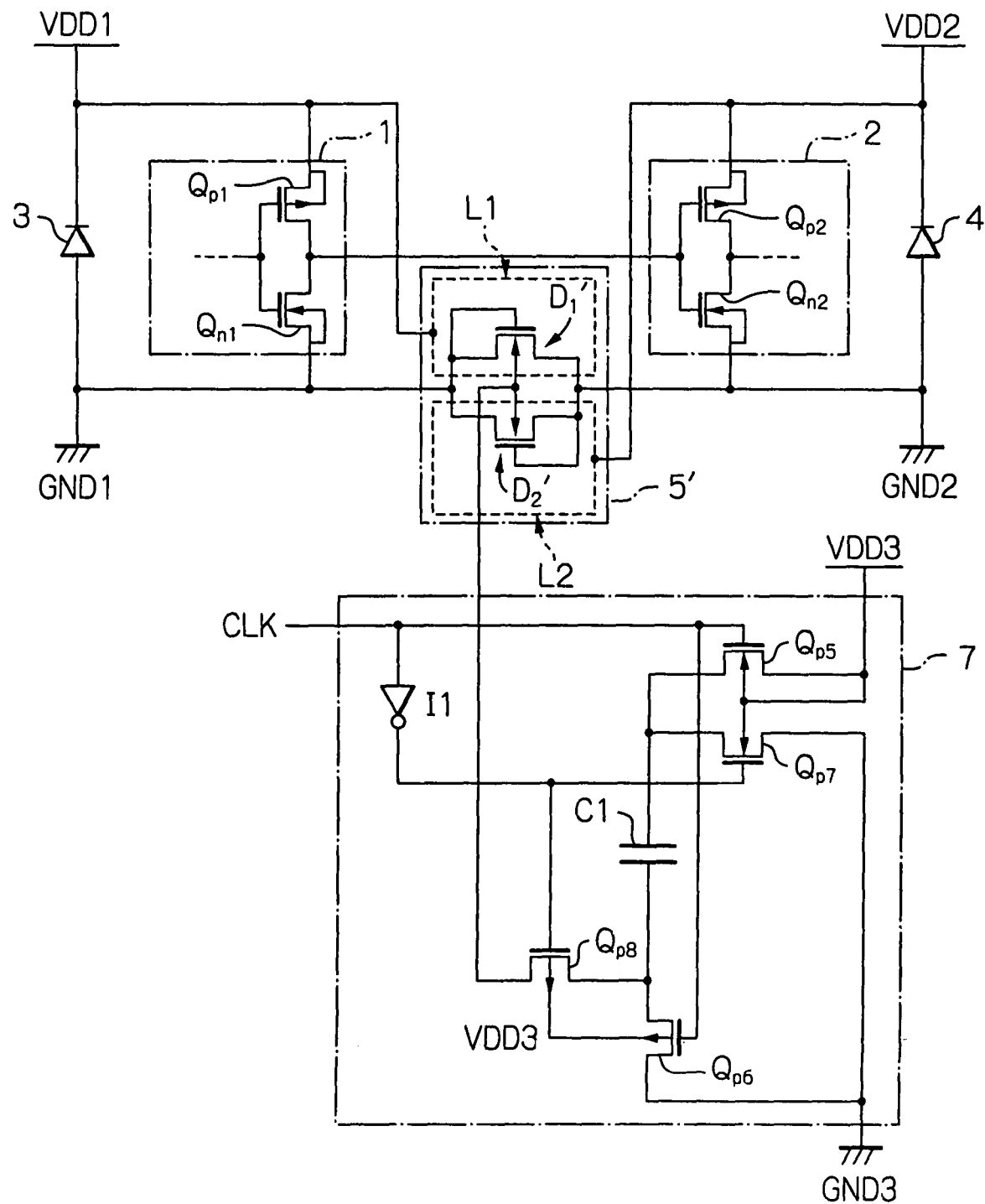
FIG. 3 is a circuit diagram illustrating a first embodiment of the semiconductor device according to the present invention.

In FIG. 3, which illustrates a first embodiment of the semiconductor device according to the present invention, the bi-directional ESD diode circuit 5 of FIG. 1 is replaced by a bi-directional ESD diode circuit 5' and the bi-directional ESD diode circuit 6 of FIG. 1 is not provided. Also, a back gate potential adjusting circuit 7 is connected to the bi-directional ESD diode circuit 5'.

The bi-directional ESD diode circuit 5' is constructed by diodes D1' and D2'. The diode D1' includes a diode-connected n-type field effect transistor or MOS transistor where a gate and one of a source aid a drain are connected to the ground terminal GND1, the other of the source and the drain is connected to the ground terminal GND2, and a back gate is connected to the back gate potential adjusting circuit 7. Also, the diode D2' includes a diode-connected n-type field effect transistor or MOS transistor where a gate and one of a source and a drain are connected to the ground terminal GND2, the other of the source and the drain is connected to the ground terminal GND1, and a back gate is connected to the back gate potential adjusting circuit 7.

Each of the diodes D1' and D2' is formed within a region electrically-isolated from the semiconductor substrate of the single semiconductor chip as indicated by dotted lines L1 and L2, respectively. In this case, the region indicated by the dotted line L1 is connected to the power supply terminal VDD1, and the region indicated by the dotted line L2 is connected to the power supply terminal VDD2. This will be explained later in detail.

The back gate potential adjusting circuit 7 is constructed by a charge-pump type step-down circuit powered by a power supply terminal VDD3 and a ground terminal GND3, and includes four p-channel MOS transistors $Q_5$, $Q_{p6}$, $Q_{p7}$ and $Q_{p8}$, a step-down capacitor C1, and an inverter I1. The inverter I1 would be a series of a p-channel MOS transistor and an n-channel MOS transistor (not shown) connected between the power supply terminal VDD3 and the ground terminal GND3.

A clock signal CLK is supplied directly to the MOS transistors $Q_{p5}$ and $Q_{p6}$, and the clock signal ClK is supplied through the inverter I1 to the MOS transistors $Q_{p7}$ and $Q_{p8}$.

The MOS transistor $Q_{p5}$ is connected between the power supply terminal VDD3 and a first end of the step-down capacitor C1, and the MOS transistor $Q_{p6}$ is connected between a second end of the step-down capacitor C1 and the ground terminal GND3.

The MOS transistor $Q_{p7}$ is connected between the ground terminal GND3 and the first end of the step-down capacitor C1, and the MOS transistor $Q_{p8}$ is connected between the second end of the step-down capacitor C1 and the back gates of the diodes D1' and D2'.

The back gates of the MOS transistors $Q_{p5}$, $Q_{p6}$, $Q_{p7}$ and $Q_{p8}$ are connected to the power supply terminal VDD3.

The set of the MOS transistors $Q_{p5}$ and $Q_{p6}$ as charging switching elements and the set of the MOS transistors $Q_{p7}$ and $Q_{p8}$ as discharging switching elements are complementarily turned ON and OFF by the clock signal CLK. That is, in a standby state where CLK="0" (low level), the MOS transistors $Q_{p5}$ and $Q_{p6}$ are turned ON and the MOS transistors $Q_{p7}$ and $Q_{p8}$ are turned OFF, so that the step-down capacitor C1 is charged and its voltage reaches VDD3-GND3. On the other hand, in a step-down state where CLK="1" (high level), the MOS transistors $Q_{p5}$ and $Q_{p6}$ are turned OFF and the MOS transistors $Q_{p7}$ and $Q_{p8}$ are turned ON, so that VDD3 is subtracted from the charged voltage of the step-down capacitor C1. Thus, the standby state and the step-down state are alternately repeated, so that the voltage at the source of the MOS transistor $Q_{p8}$, i.e., the voltage at the back gates Of the diodes D1' and D2' becomes lower than GND3. For example, the voltage at the back gates of the diodes D1' and D2' becomes GND3-VDD3.

In FIG. 3, note that the power supply terminal VDD3 can be replaced by the power supply terminal VDD1 or VDD2, and the ground terminal GND3 can be replaced by the ground terminal GND1 or GND2. Also, the clock signal CLK and its inverted signal can be generated by a pulse generating circuit incorporated into the back gate potential generating circuit 7.

Figure 4:
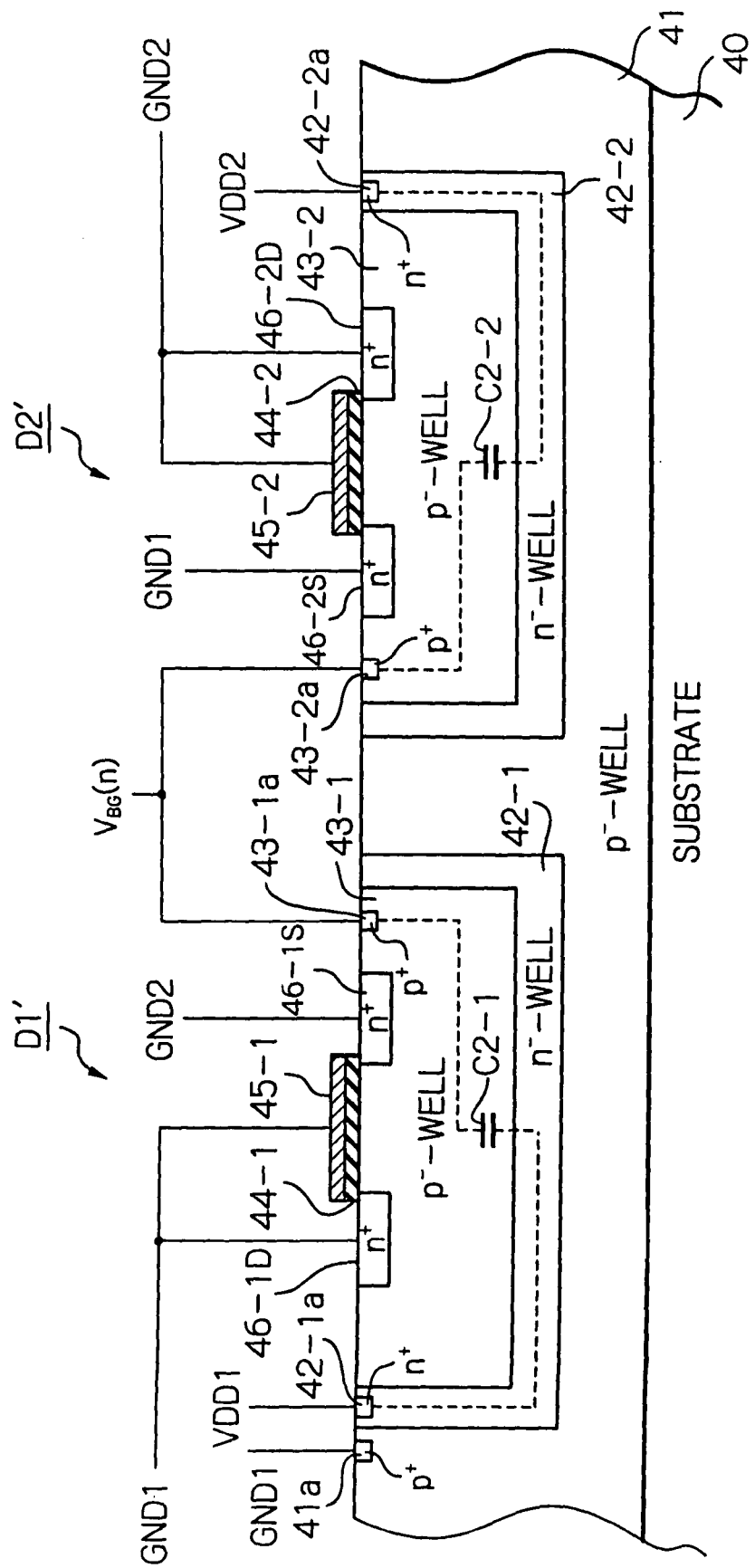
FIG. 4 is a cross-sectional view of the bi-directional diode circuit of FIG. 3.

In FIG. 4, which is a cross-sectional view of the bi-directional ESD diode circuit 5' of FIG. 3, a p⁻-type well 41 is formed on a monocrystalline silicon substrate 40. In this case, a p⁺-type contact region 41a is provided in the silicon substrate 41, so that the voltage at the ground terminal GND1 is applied thereto.

Also, n⁺-type wells 41-1 and 41-2 are formed in the p⁻-type well 41. In this case, n⁺-type contact regions 42-1a and 42-2a are formed in the n⁻-type wells 42-1 and 42-2, respectively, so that the voltages at the power supply terminals VDD1 and VDD2 are applied to the n⁻-type wells 42-1 and 42-2, respectively.

Also, the p⁻-type wells 43-1 and 43-2 are formed in the n⁻-type wells 42-1 and 42-2, respectively. In this case, n⁺-type contact regions 43-1a and 43-2a are formed in the n⁻-type wells 43-1 and 43-2, respectively, so that the output voltage $V_{BG(n)}$ of the back gate potential generating circuit 7 is applied thereto.

In the p⁻-type well 43-1, a gate insulating layer 44-1 and a gate electrode 45-1 are formed, and, an n⁺-type source region 46-1S and an n⁺-type drain region 46-1D are formed in self-alignment with the gate electrode 45-1. The gate electrode 45-1 and the n⁺-type drain region 46-1D are connected to the ground terminal GND1, and the n⁺-type source region 46-1S is connected to the ground terminal GND2.

In the p⁻-type well 43-2, a gate insulating layer 44-2 and a gate electrode 45-2 are formed, and an n⁺-type source region 46-2S and an n⁺-type drain region 46-2D are formed in self-alignment with the gate electrode 45-2. The gate electrode 45-2 and the n⁺-type drain region 46-2D are connected to the ground terminal GND2, and the n⁺-type source region 46-2S is connected to the ground terminal GND1.

Note that the n⁻-type wells 42-1 and 42-2 correspond to the regions as indicated by the lines L1 and L2, respectively, of FIG. 3.

In the diode D1', a parasitic capacitance C2-1 is formed between the n⁻-type well 42-1 and the p⁻-type well 43-1. The back gate potential of the diode D1' is adjusted by using this parasitic capacitance C2-1 to adjust the threshold voltage of the diode D1'. That is, the ON resistance of the diode D1' can be decreased in an ESD protection mode, and the diode D1' can be completely turned OFF in a usual operation mode.

In the diode D2', a parasitic capacitance C2-2 is formed between the n⁻-type well 42-2 and the p⁻-type well 43-2. The back gate potential of the diode D2' is adjusted by using this parasitic capacitance C2-2 to adjust the threshold voltage of the diode D2'. That is, the ON resistance of the diode D2' can be decreased in an ESD protection node, and the diode D2' can be completely turned OFF in a usual operation mode.

Figure 5:
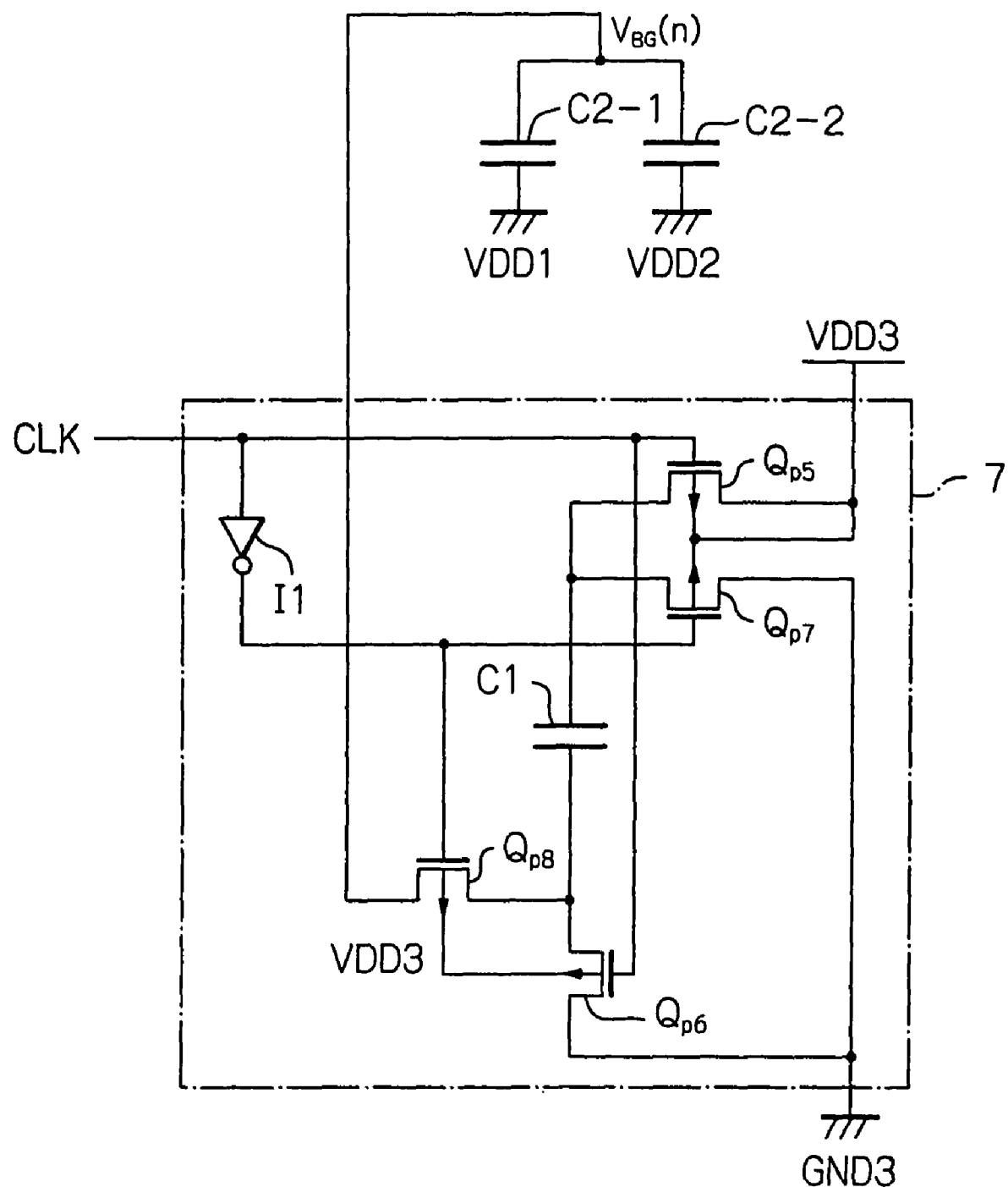
FIG. 5 is an equivalent circuit diagram of the bi-directional diode circuit of FIG. 4.

In FIG. 5, which illustrates an equivalent circuit diagram of the bi-directional diode circuit 5' of FIG. 4, the parasitic capacitances C2-1 and C2-2 are connected to the back gate potential generating circuit 7. Therefore, a combined capacitance of the parasitic capacitances C2-1 and C2-2 serves as a smoothing capacitor for the output voltage $V_{BG(n)}$ of the back gate potential adjusting circuit 7. In this case, a back gate potential $V_{BG(n)}$ is given in common to the diodes D1' and D2'.

The usual operation mode of the back gate potential adjusting circuit 7 of FIG. 5 is explained next with reference to FIGS. 6A and 6B. In the usual operation mode, note that predetermined voltages are applied to the ground terminal GND3 and the power supply terminals VDD1, VDD2 and VDD3. Also, the clock signal CLK, is supplied to the back gate potential adjusting circuit 7.

As explained above, when CLK="0" (low level), the MOS transistors $Q_{p5}$ and $Q_{p6}$ are turned ON and the MOS transistors $Q_{p7}$ and $Q_{p8}$ are turned OFF to charge the step-down capacitor C1, so that the voltage of the step-down capacitor C1 reaches VDD3-GND3. Then, when CLK="1" (high level), the MOS transistors $Q_{p5}$ and $Q_{p6}$ are turned OFF and the MOS transistors $Q_{p7}$ and $Q_{p8}$ are turned ON to discharge the step-down capacitor C1, so that the voltage of the step-down capacitor C1 reaches GND3-VDD3. That is, since the MOS transistor $Q_{p8}$ is turned ON, the back gate potential $V_{BG(n)}$ is brought close to GND3-VDD3, i.e., $$V_{BG(n)} = GND3 - VDD3$$

Figure 6A:
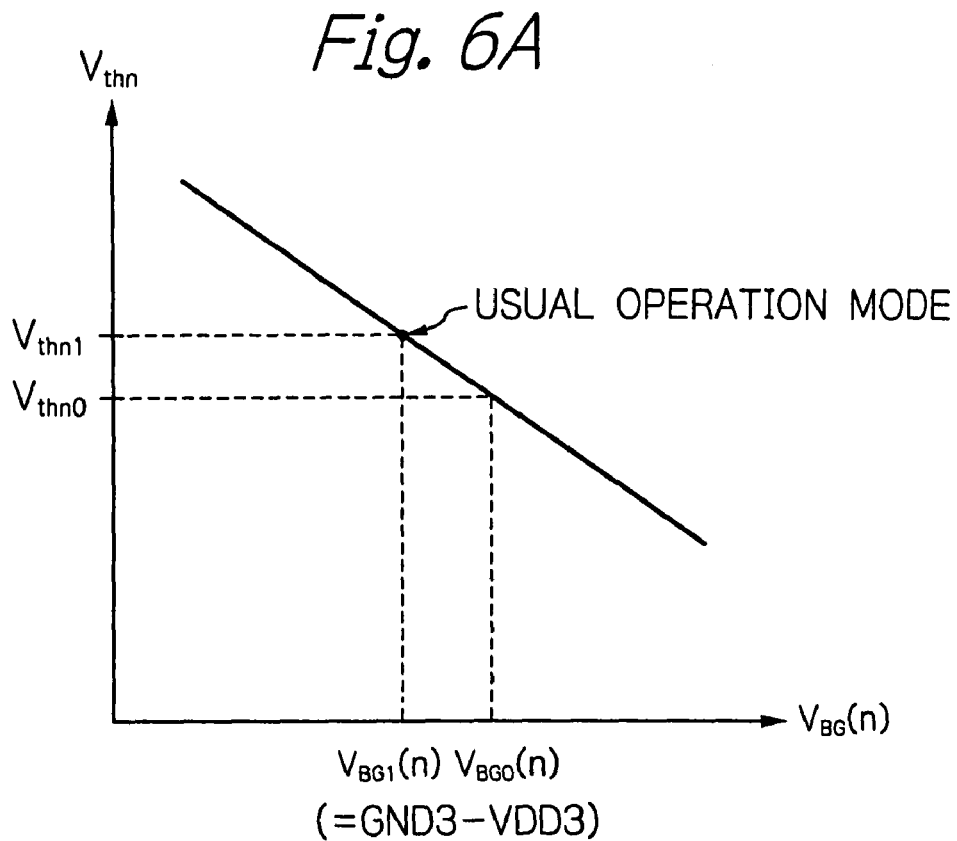
FIG. 6A is a graph explaining the threshold voltage of the diodes of the bi-directional diode circuit of FIG. 4 in a usual operation mode.
Figure 6B:
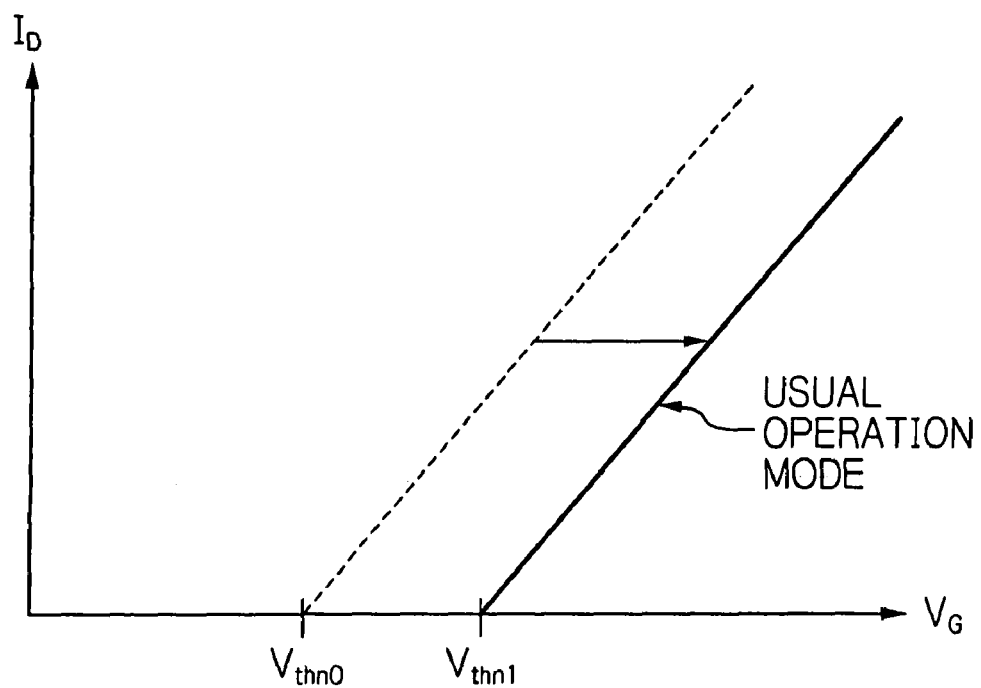
FIG. 6B is a graph explaining the ON resistance of the diodes of the bidirectional diode circuit of FIG. 4 in a usual operation mode.

Thus, as illustrated in FIG. 6A, the back gate potential $V_{BG(n)}$ of the diodes D1' and D2' is decreased from $V_{BG0(n)}$ to $V_{BG1(n)}$ (=GND3-VDD3) so as to increase the threshold voltage $V_{thn}$ of the diodes D1' and D2' from $V_{thn0}$ to $V_{thn1}$. As a result, as illustrated in FIG. 6B where $V_G$ is a gate voltage of the diodes D1' and D2', and ID is a drain current of each of the diodes D1' and D2', the ON resistance can be increased and the diodes D1' and D2' can be surely maintained at an OFF state, thus avoiding transfer of noise between the separated ground terminals GND1 and GND2.

In FIG. 7, which is a cross-sectional view of the MOS transistor $Q_{p8}$ of the back bias potential adjusting circuit 7 of FIG. 3, an n⁻-type well 42-3 is formed in the p⁻-type well 41 of FIG. 4. In this case, an n⁺-type contact region 42-3a is formed in the n⁻-type well 42-3, so that the voltage at the power supply terminal VDD3 is applied thereto, In the n⁻-type well 42-3, a gate insulating layer 44-3 and a gate electrode 45-3 are formed, and a p⁺-type source region 46-3S and a p⁺-type drain region 46-3D are formed in self-alignment with the gate electrode 45-3. The voltage of the gate electrode 45-3 is indefinite in an ESD protection mode, the p⁺-type drain region 46-3D is connected to the step-down capacitor C1, and the p⁺-type source region 46-3S is connected to the parasitic capacitances C2-1 and C2-2.

In MOS transistor $Q_{p8}$, a parasitic diode PD1 and a parasitic capacitance C3 serving as a CR time constant circuit are formed in series between the p⁻-type well 41 and the n⁻-type well 42-3.

Figure 9A:
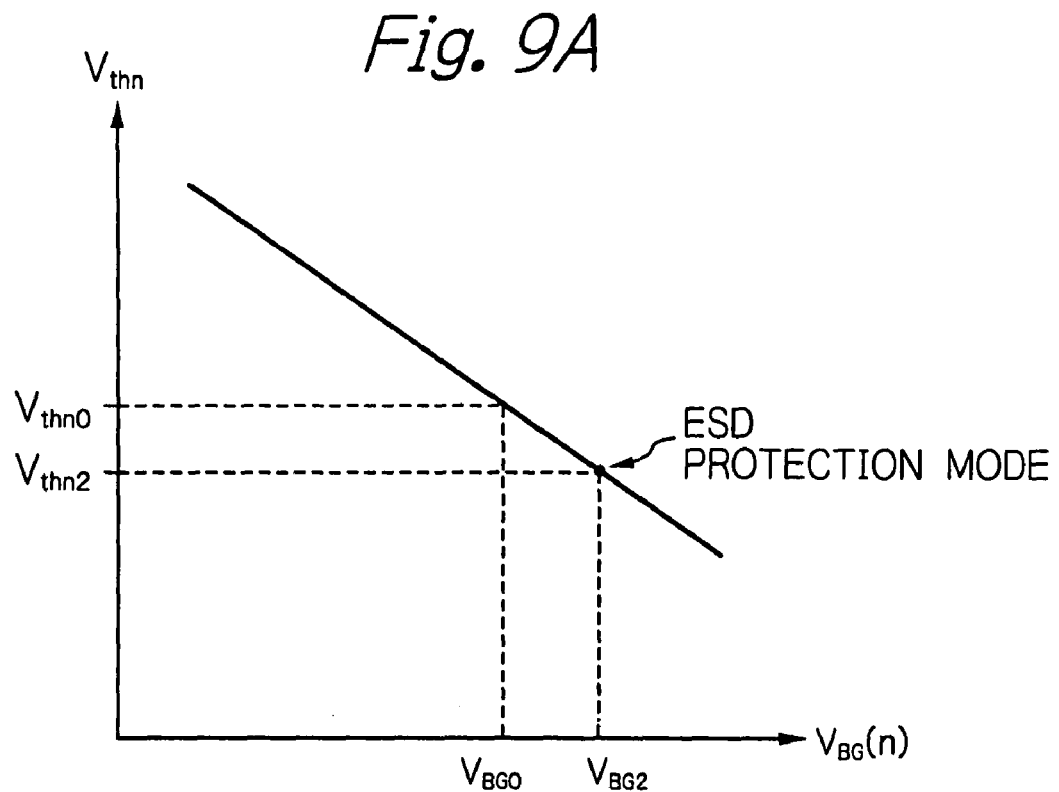
FIG. 9A is a graph explaining the threshold voltage of the diodes of the bi-directional diode circuit of FIG. 4 in an ESD protection mode.
Figure 9B:
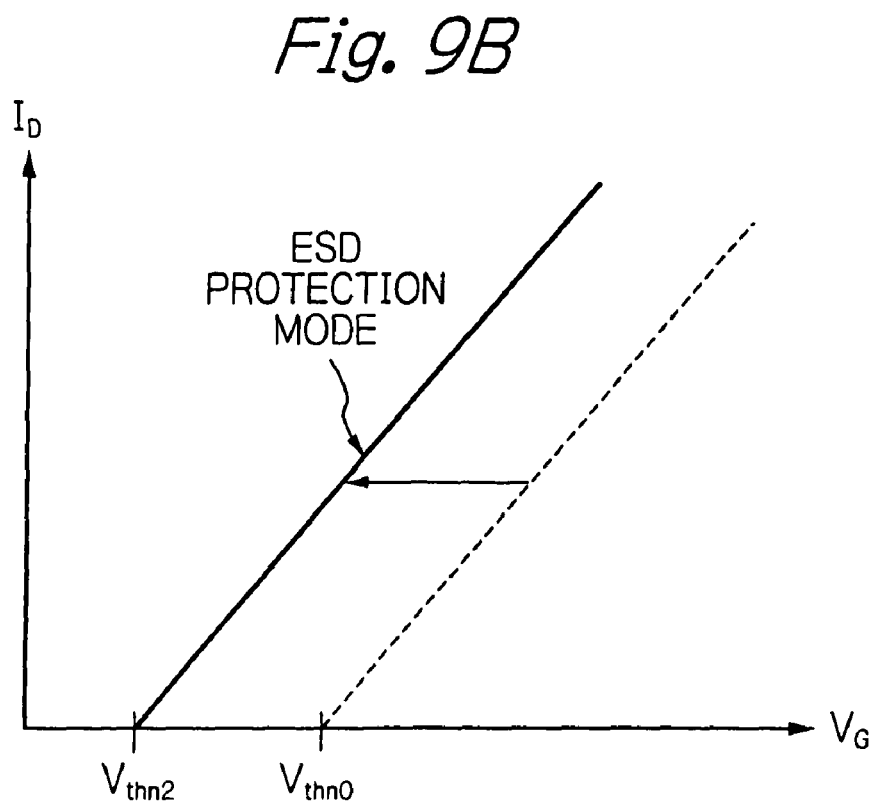
FIG. 9B is a graph explaining the ON resistance of the diodes of the bi-directional diode circuit of FIG. 4 in an ESD protection.

The ESD protection mode of the back gate potential adjusting circuit 7 of FIG. 7 is explained next with reference to FIGS. 8, 9A and 9B. In this case, the power supply terminal VDD3 is in a floating state. Also, assume that an electrostatic charge is applied between the power supply terminal VDD1 and the ground terminal GND2, so that the voltage at the power supply terminal VDD1 is rapidly increased due to an electrostatic discharge phenomenon.

That is, at time t1 as illustrated in FIG. 8, the voltage at the n⁻-type well 42-1, i.e., the back gate potential $V_{BG}$ of the diode D1' is rapidly increased by the parasitic capacitance C2-1. As a result, as illustrated in FIG. 9A, as the back gate potential $V_{BG(n)}$ is increased from $V_{BG0(n)}$ to $V_{BG2(n)}$, the threshold voltage $V_{thn}$ is also decreased from $V_{thn0}$ to $V_{thn2}$.

In the above-mentioned state, after time t2 as illustrated in FIG. 8, the voltage at the p⁺-type well 43-1, i.e., the back gate potential $V_{BG(n)}$ is slowly decreased by the CR time constant circuit formed by the parasitic diode PD1 and the parasitic capacitance C3. Thus, the back gate potential $V_{BG}$ is maintained at a high level for a long time from time t2 to time t3. As a result, as illustrated in FIG. 9B where VG is a gate voltage of the diode D1' and $I_D$ is a drain current of the diode D1', thle ON resistance can be decreased and the diode D1' can be surely maintained at an ON state.

Thus, when the voltage at the power supply terminal VDD1 is rapidly increased, the threshold voltage of the diode D1' is decreased by the increased back gate potential $V_{BG(n)}$ as illustrated in FIG. 8, to decrease the ON resistance of the diode D1'. In this case, the p-channel MOS transistor $Q_{p1}$ of the output buffer of the circuit block 1 of FIG. 3 is unstable so that the p-channel MOS transistor $Q_{p1}$ would be turned ON. In this case, a large difference in potential would be generated between the gate and source of the li-channel MOS transistor $Q_{n2}$ of the input buffer of the circuit block 2 of FIG. 3. If such a large difference in potential exceeds the breakdown voltage of the gate insulating layer of the n-channel MOS transistor $Q_{n2}$, the n-channel MOS transistor $Q_{n2}$ would be broken, which would invite a malfunction of the circuit block 2. On the other band, if an electrostatic discharge current flows from the power supply terminal VDD1 via the ESD protection circuit 3, the ground terminal GND1 and the diode D1' to the ground terminal GND2, a gate-to-source voltage of the n-channel MOS transistor $Q_{n2}$ is represented by a sum of a clamp voltage of the ESD protection circuit 3, a product of the ON resistance of the diode D1' and the electrostatic discharging current and a product of other wiring resistance and the electrostatic discharging current. Therefore, when the threshold voltage of the diode D1' is decreased to decrease the ON resistance thereof, the gate-to-source voltage of the n-channel MOS transistor $Q_{n2}$ can be decreased, so that the breakdown of the n-channel MOS . transistor $Q_{p2}$ can be avoided, i.e., the malfunction of the circuit block 2 can be avoided.

Figure 10:
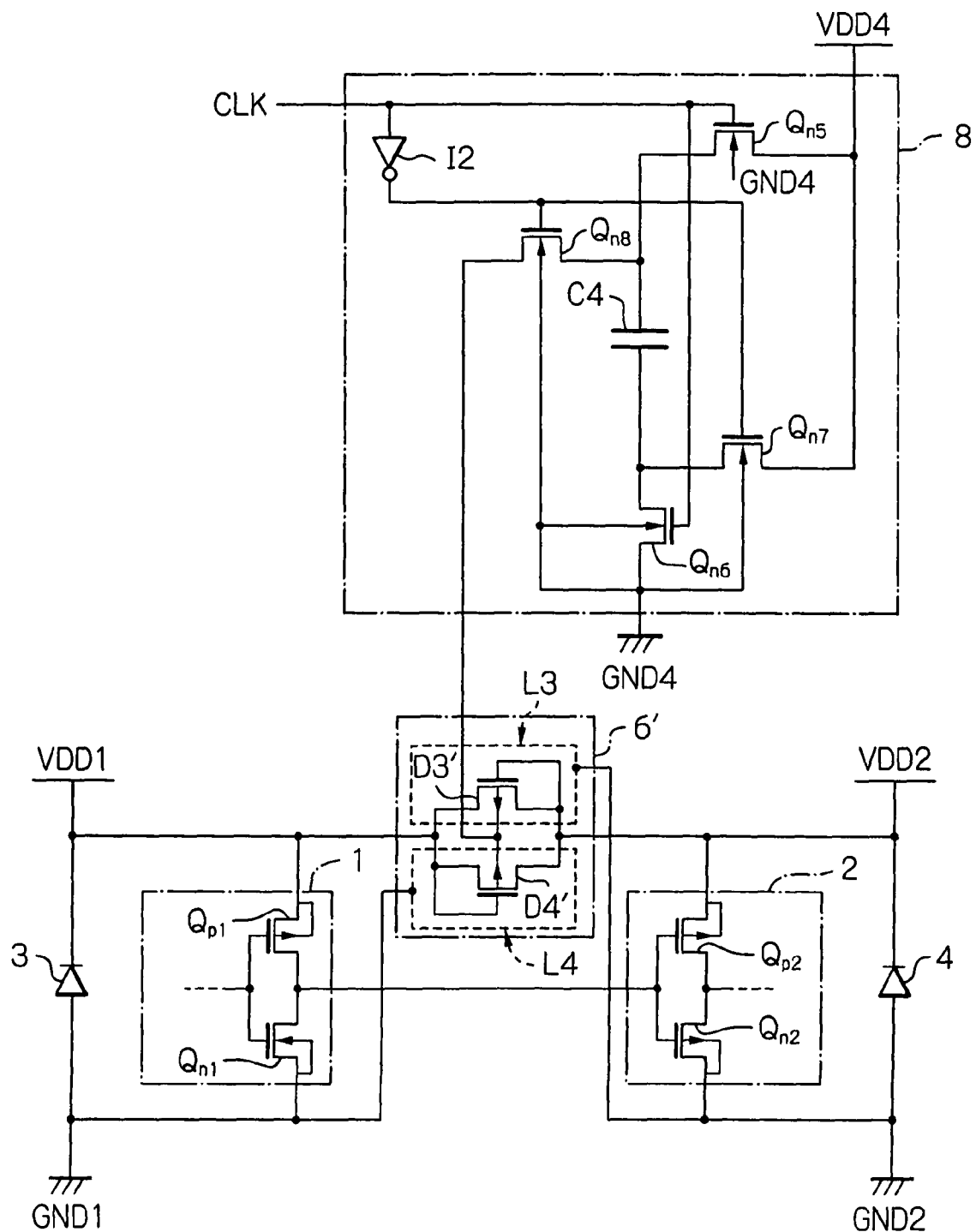
FIG. 10 is a circuit diagram illustrating a second embodiment of the semiconductor device according to the present invention.

In FIG. 10, which illustrates a second embodiment of the semiconductor device according to the present invention, the bi-directional ESD diode circuit 6 of FIG. 1 is replaced by a bi-directional ESD diode circuit 6' and the bi-directional ESD diode circuit 5 of FIG. 1 is not provided. Also, a back gate potential adjusting circuit 8 is connected to the bi-directional ESD diode circuit 6'.

The bi-directional ESD diode circuit 6' is constructed by diodes D3' and D4'. The diode D3' includes a diode-connected p-type field effect transistor or MOS transistor where a gate and one of a source and a drain are connected to the power supply terminal VDD2, the other of the source and the drain is connected to the power supply terminal VDD1, and a back gate is connected to the back gate potential adjusting circuit 8. Also, the diode D2' includes a diode-connected p-type field effect transistor or MOS transistor where a gate and one of a source and a drain are connected to the power supply terminal VDD1, the other of the source and the drain is connected to the power supply terminal VDD2, and a back gate is connected to the back gate potential adjusting circuit 8.

Each of the diodes D3' and D4' is formed within a region electrically-isolated from the semiconductor substrate of the single semiconductor chip as indicated by dotted lines L3 and L4, respectively. In this case, the region indicated by the dotted line L3 is connected to the ground terminal GND2, and the region indicated by the dotted line L4 is connected to the ground terminal GND1. This will be explained later in detail.

The back gate potential adjusting circuit 8 is constructed by a charge-pump type step-up circuit powered by a power supply terminal VDD4 and a ground terminal GND4, and includes four n-channel MOS transistors $Q_{n6}$, $Q_{n5}$, $Q_{n7}$ and $Q_{n8}$, a step-up capacitor C4, and an inverter I2. The inverter I2 would be a series of a p-channel MOS transistor and an n-channel MOS transistor (not shown) connected between the power supply terminal VDD4 and the ground terminal GND4.

A clock signal CLK is supplied directly to the MOS transistors $Q_{n5}$ and $Q_{n6}$, and the clock signal CLK is supplied through the inverter I2 to the MOS transistors $Q_{p7}$ and $Q_{p8}$.

The MOS transistor $Q_{p6}$ is connected between the power supply terminal VDD4 and a first end of the step-up capacitor C4, and the MOS transistor $Q_{n6}$ is connected between a second end of the step-up capacitor C4 and the ground terminal GND4.

The MOS transistor $Q_{n7}$ is connected between the power supply terminal VDD4 and the first end of the step-up capacitor C4, and the MOS transistor $Q_{n8}$ is connected between the second end of the step-up capacitor C4 and the back gates of the diodes D3' and D4'.

The back gates of the MOS transistors $Q_{n5}$, $Q_{n6}$, $Q_{n7}$ and $Q_{n8}$ are connected to the ground terminal GND4.

The set of the MOS transistors $Q_{n6}$ and $Q_{n6}$ as charging switching elements and the set of the MOS transistors $Q_{n7}$ and $Q_{n8}$ as discharging switching elements are complementarily turned ON and OFF by the clock signal CLK. That is, in a standby state where CLK="1" (high level), the MOS transistors $Q_{n5}$ and $Q_{n6}$ are turned ON and the MOS transistors $Q_{n7}$ and $Q_{n8}$ are turned OFF, so that the step-up capacitor C4 is charged and its voltage reaches VDD4-GND4. On the other hand, in a step-up state where CLK="0" (low level), the MOS transistors $Q_{n5}$ and $Q_{n6}$ are turned OFF and the MOS transistors $Q_{n7}$ and $Q_{n8}$ are turned ON, so that VDD4 is added to the charged voltage of the step-up capacitor C4. Thus, the standby state and the step-up state are alternately repeated, so that the voltage at the source of the MOS transistor $Q_{n6}$, i.e., the voltage at the back gates of the diodes D3' and D4' becomes higher than VDD4. For example, the voltage at the back gates of the diodes D3' and D4' becomes 2·VDD4.

In FIG. 10, note that the power supply terminal VDD4 can be replaced by the power supply terminal VDD1 or VDD2, and the ground terminal GND4 can be replaced by the ground terminal GND1 or GND2. Also, the clock signal CLK and its inverted signal can be generated by a pulse generating circuit incorporated into the back gate potential generating circuit 8.

Figure 11:
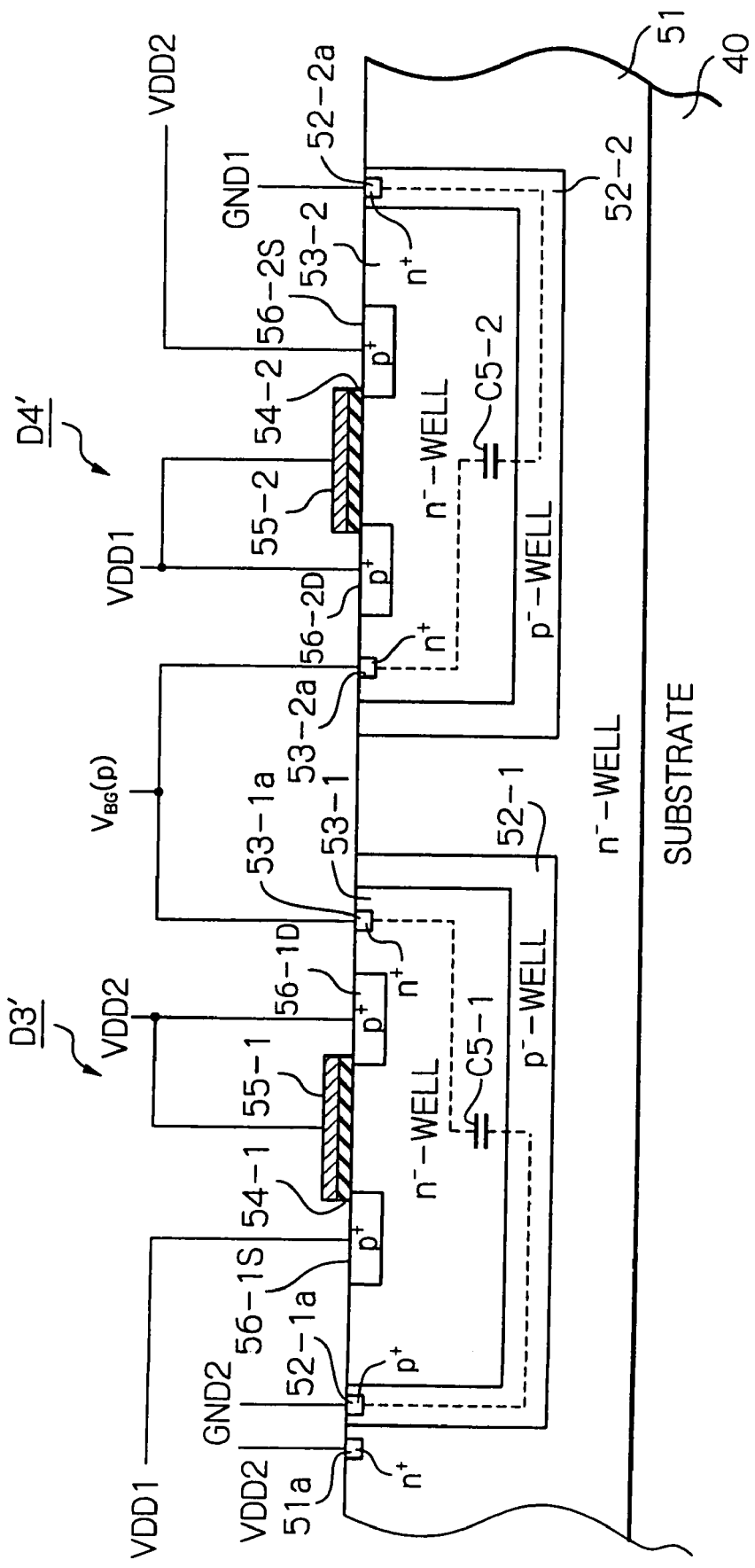
FIG. 11 is a cross-sectional view of the bi-directional diode circuit of FIG. 10.

In FIG. 11, which is a cross-sectional view of the bi-directional ESD diode circuit 6' of FIG. 10, an n⁻-type well 51 is formed in the monocrystalline silicon substrate 40. In this case, an n⁺-type contact region 51a is provided in the n⁻-type well 51, so that the voltage at the power supply terminal VDD2 is applied thereto.

Also, p⁺-type wells 51-1 and 51-2 are formed in the n⁻-type well 51. In this case, the p⁺-type contact regions 52-1a and 52-2a are formed in the p⁻-type wells 52-1 and 52-2, respectively, so that the voltages at the ground terminals GND2 and GND1 are applied to the p⁻-type wells 52-1 and 52-2, respectively.

Also, the n⁻-type wells 53-1 and 53-2 are formed in the p⁻-type wells 52-1 and 52-2, respectively. In this case, p⁻-type contact regions 53-1a and 53-2a are formed in the p⁻-type wells 53-1 and 53-2, respectively, so that the output voltage $V_{BG(p)}$ of the back gate potential generating circuit 7 is applied thereto.

In the n⁻-type well 53-1, a gate insulating layer 54-1 and a gate electrode 55-1 are formed, and a p⁺-type source region 56-1S and a p⁺-type drain region 56-1D are formed in self-alignment with the gate electrode 55-1. The gate electrode 55-1 and the p⁺-type drain region 56-1D are connected to the power supply terminal VDD2, and the p⁺-type source region 56-1S is connected to the power supply terminal VDD2.

In the n⁻-type well 53-2, a gate insulating layer 54-2 and a gate electrode 55-2 are formed, and a p⁺-type source region 56-2S and a p⁺-type drain region 56-2D are formed in self-alignment with the gate electrode 55-2. The gate electrode 55-2 and the p⁺-type drain region 56-2D are connected to the power supply terminal VDD1, aid the p⁺-type source region 56-2S is connected to the power supply terminal VDD2.

Note that the p⁻-type wells 52-1 and 52-2 correspond to the regions as indicated by the lines L3 and L4, respectively, of FIG. 10.

In the diode D3', a parasitic capacitance C5-1 is formed between the p⁻-type well 52-1 and the n⁻-type well 53-1. The back gate potential of the diode D3' is adjusted by using this parasitic capacitance C5-1 to adjust the threshold voltage of the diode D3'. That is, the ON resistance of the diode D3' can be decreased in an ESD protection mode, and the diode D3' can be completely turned OFF in a usual operation mode.

In the diode D4', a parasitic capacitance C5-2 is formed between the p⁻-type well 52-2 and the n⁻-type well 53-2. The back gate potential of the diode D4' is adjusted by using this parasitic capacitance C5-2 to adjust the threshold voltage of the diode D4'. That is, the ON resistance of the diode D4' can be decreased in an ESD protection mode, and the diode D4' can be completely turned OFF in a usual operation mode.

Figure 12:
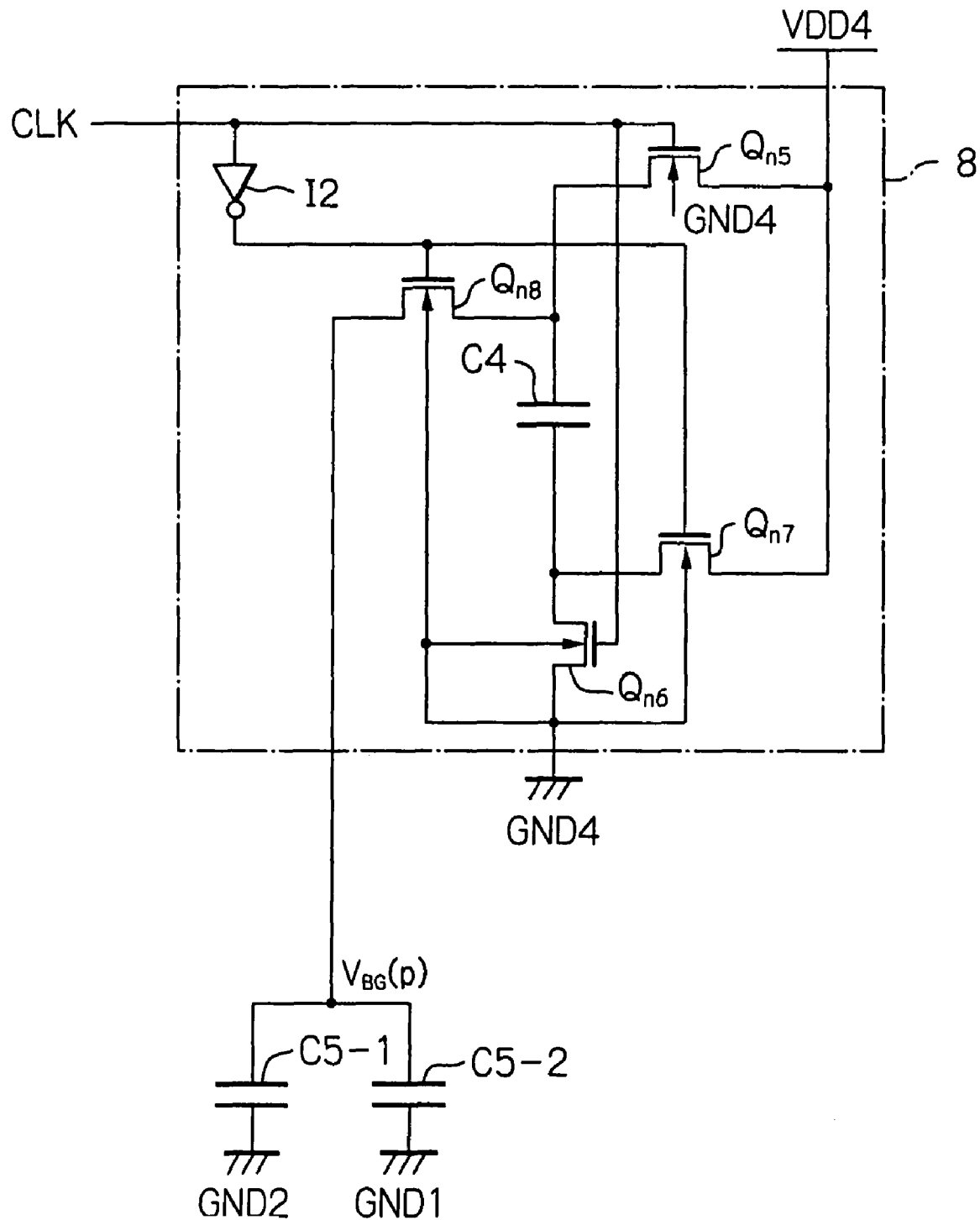
FIG. 12 is an equivalent circuit diagram of the bi-directional diode circuit of FIG. 11.

In FIG. 12, which illustrates an equivalent circuit diagram of the bi-directional diode circuit 6' of FIG. 12, the parasitic capacitances C5-1 and C5-2 are connected to the back gate potential generating circuit 8. Therefore, a combined capacitance of the parasitic capacitances C5-1 and C5-2 serves as a smoothing capacitor for the output voltage $V_{BG(p)}$ of the back gate potential adjusting circuit 8. In this case, a back gate potential $V_{BG(p)}$ is given in common to the diodes D3' and D4'.

The usual operation mode of the back gate potential adjusting circuit 8 of FIG. 12 is explained next ifith reference to FIGS. 12A and 12B. In the usual operation mode, note that predetermined voltages are applied to the ground terminals GND1, GND2 and GND3 and the power supply terminal VDD4. Also, the clock signal CLK is supplied to the back gate potential adjusting circuit 8.

As explained above, when CLK="1" (high level), the MOS transistors $Q_{n5}$ and $Q_{n6}$ are turned ON and the MOS transistors $Q_{n7}$ and $Q_{n6}$ are turned OFF to charge the step-up capacitor C4, so that the voltage of the step-up capacitor C4 reaches VDD4-GND4. Then, when CLK="0" (low level), the MOS transistors $Q_{n5}$ and $Q_{n6}$ are turned OFF and the MOS transistors $Q_{n7}$ and $Q_{n8}$ are turned ON to discharge the step-up capacitor C4, so that the voltage of the step-up capacitor C4 reaches 2·VDD4. That is, since the MOS transistor $Q_{n8}$ is turned ON, the back gate potential $V_{BG(n)}$ is brought close to VDD4, i.e., $$V_{BG(p)}=2 \cdot VDD4$$

Figure 13A:
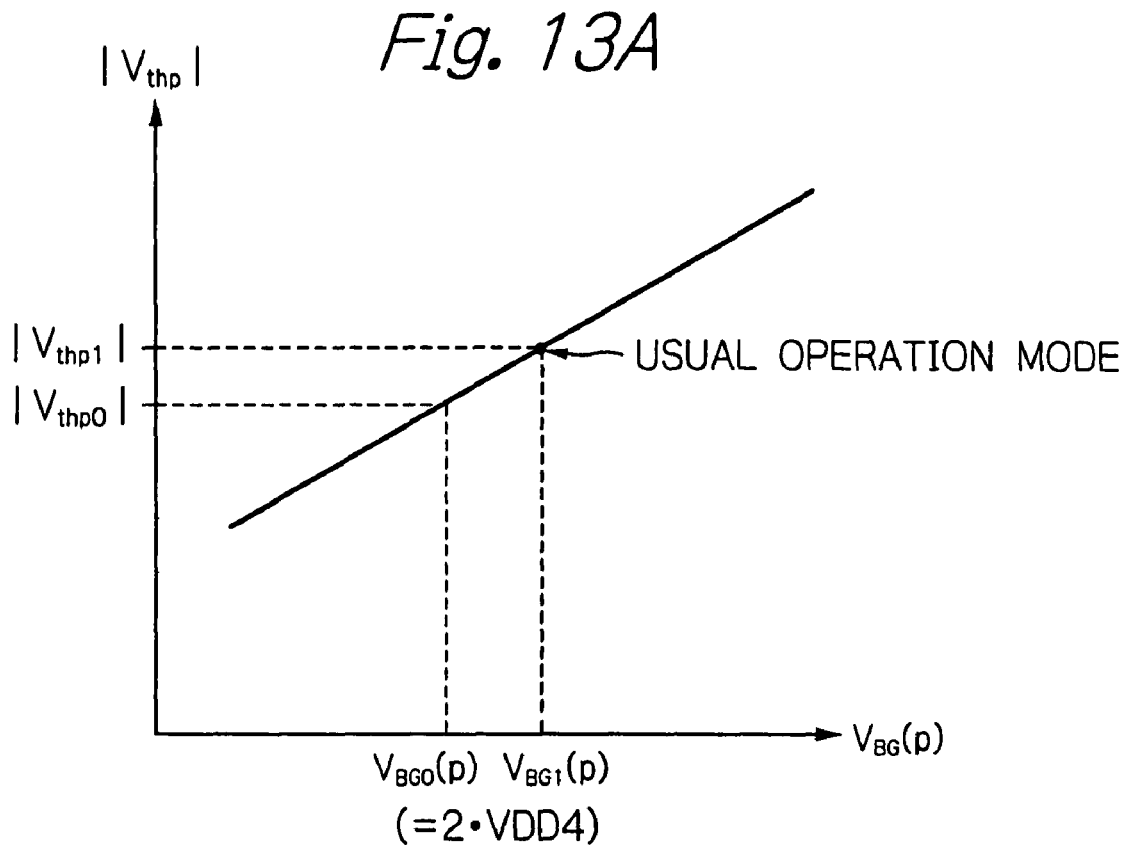
FIG. 13A is a graph explaining the threshold voltage of the diodes of the bi-directional diode circuit of FIG. 11 in a usual operation mode.
Figure 13B:
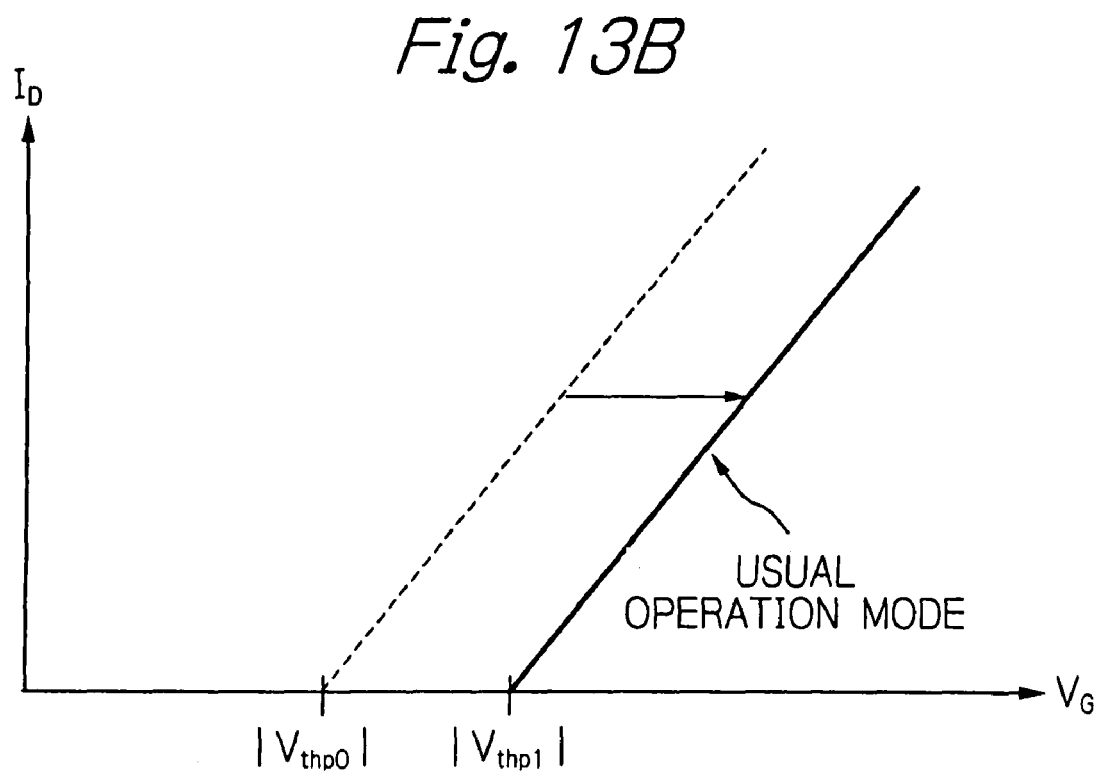
FIG. 13B is a graph explaining the ON resistance of the diodes of the bi-directional diode circuit of FIG. 11 in a usual operation mode.

Thus, as illustrated in FIG. 13A, the back gate potential $V_{BG(p)}$ of the diodes D3' and D4' is increased from $V_{BG0(p)}$ to $V_{BG1(p)}$ (=2·VD1D4) so as to increase the absolute value of the threshold voltage $V_{thp}$ of the diodes D3' and D4' from $V_{thp0}$ to $V_{thp1}$. As a result, as illustrated in FIG. 13B where $V_G$ is a gate voltage of the diodes D3' and D4' and $I_D$ is a drain current of each of the diodes D3' and D4', the ON resistance can be increased and the diodes D3' and D4' can be surely maintained at an OFF state, thus avoiding transfer of noise between the separated power supply terminals VDD1 and VDD2.

Figure 14:
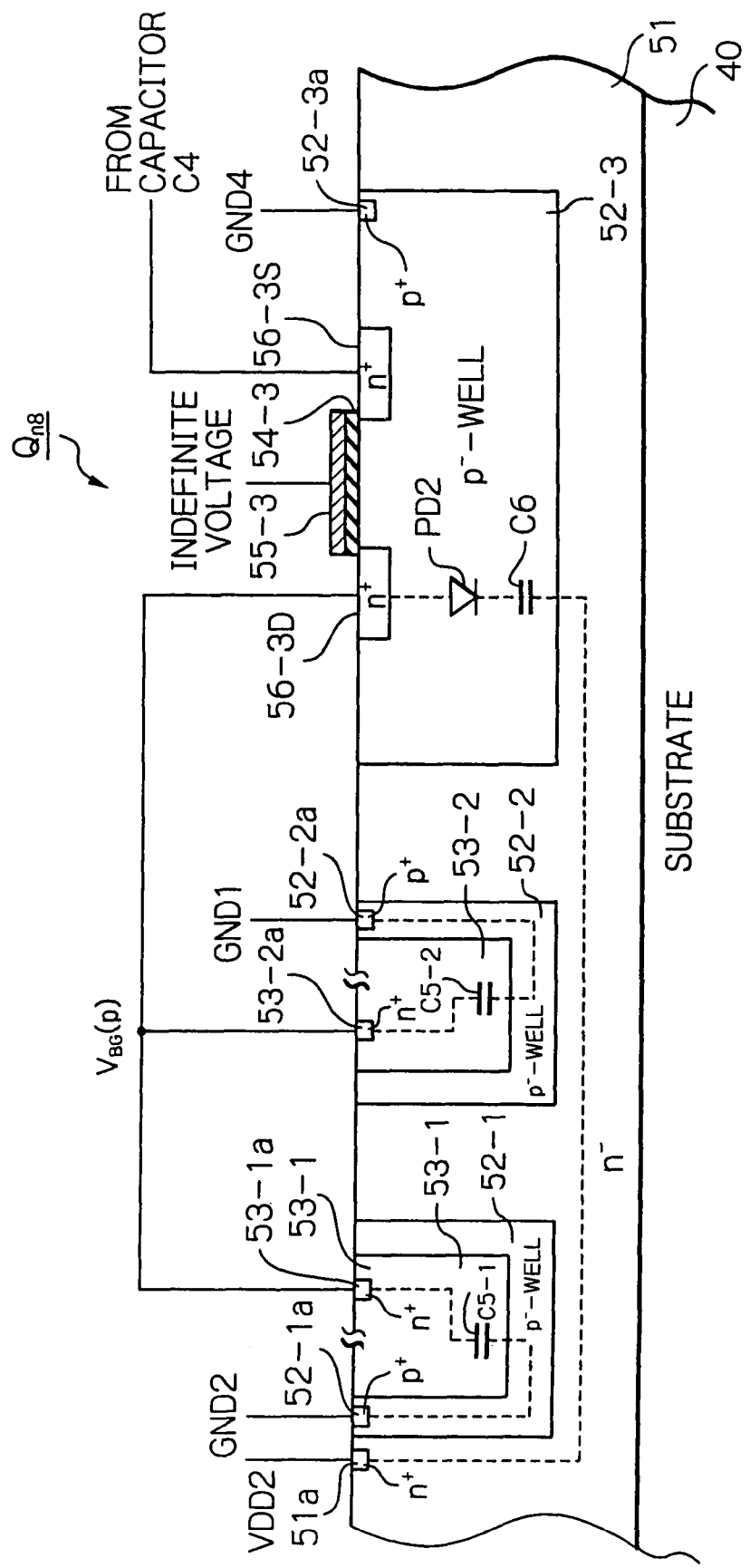
FIG. 14 is a cross-sectional view of the back gate potential adjusting circuit of FIG. 10.

In FIG. 14, which is a cross-sectional view of the MOS transistor $Q_{n8}$ of the back bias potential adjusting circuit 8 of FIG. 10, a p⁻-type well 52-3 is formed in the n⁻-type well 51 of FIG. 11. In this case, a p⁺-type contact region 52-3a is formed in the n⁻-type well 52-3, so that the voltage at the ground terminal GND4 is applied thereto.

In the n⁻-type well 52-3, a gate insulating layer 54-3 and a gate electrode 55-3 are formed, and an n⁺-type source region 56-3S and an n⁺-type drain region 56-3D are formed in self-alignment with the gate electrode 55-3. The voltage of the gate electrode 55-3 is indefinite in an ESD protection modes the n⁺-type drain region 56-3D are connected to the step-up capacitor C4, and the n⁺-type source region 56-3S is connected to the parasitic capacitances C5-1 and C5-2.

In MOS transistor $Q_{n8}$, a parasitic diode PD2 and a parasitic capacitance C6 serving as a CR time constant circuit are formed in series between the n⁻-type well 51 and the n⁻-type well 52-3.

The ESD protection mode of the back gate potential adjusting circuit 8 of FIG. 13 is explained next with reference to FIGS. 15, 16A and 16B. In this case, the power supply terminal VDD4 is in a floating state. Also, assume that an electrostatic charge is applied between the power supply terminal VDD1 and the ground terminal GND2, so that the voltage at the ground terminal GND2 is rapidly decreased due to an electrostatic discharge phenomenon.

Figure 15:
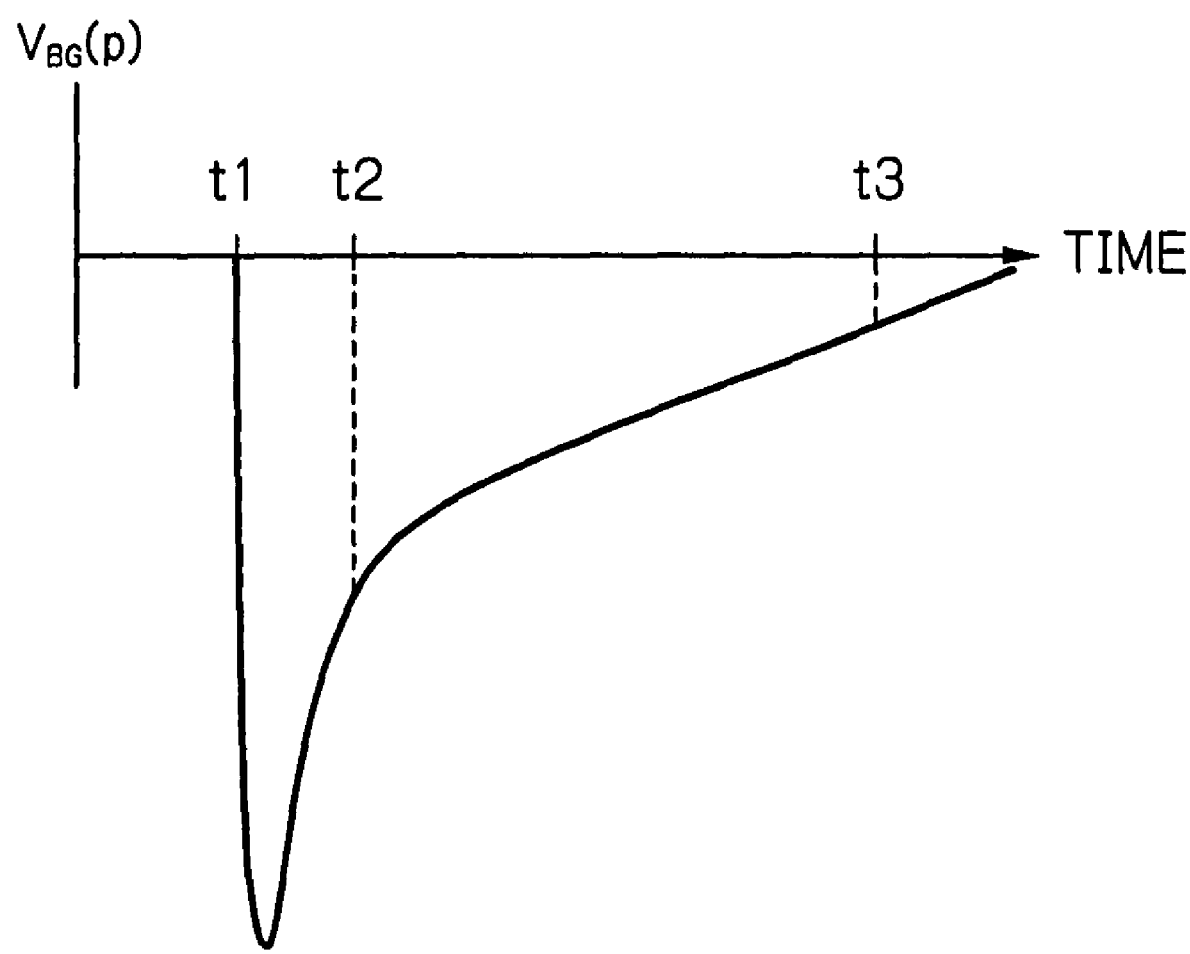
FIG. 15 is a timing diagram for explaining the back gate potential of FIG. 14.
Figure 16A:
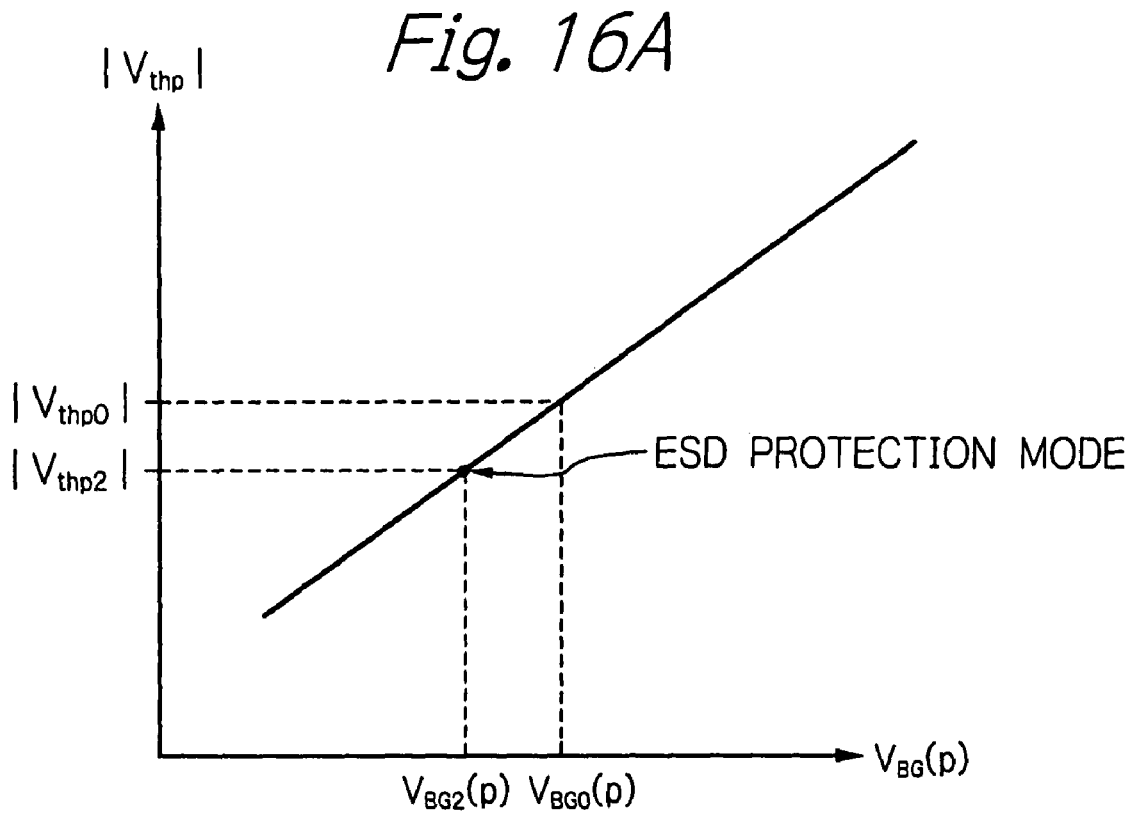
FIG. 16A is a graph explaining the threshold voltage of the diodes of the bi-directional diode circuit of FIG. 11 in an ESD protection mode.
Figure 16B:
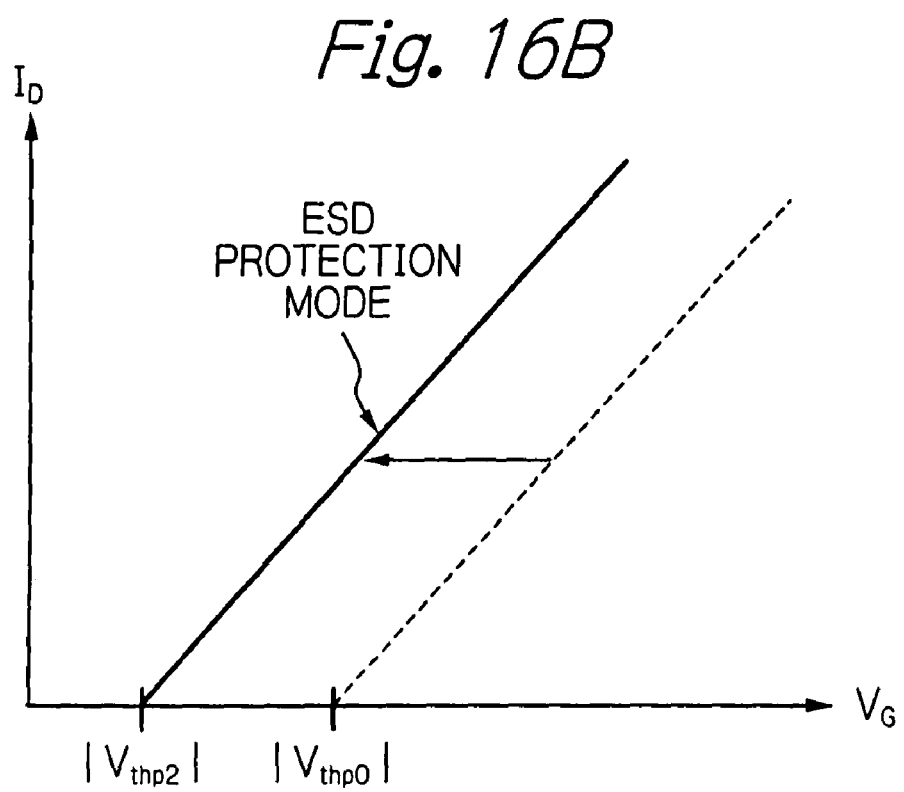
FIG. 16B is a graph explaining the ON resistance of the diodes of the bi-directional diode circuit of FIG. 11 in an ESD protection.

That is, at time t1 as illustrated in FIG. 15, the voltage at the p⁻-type well 52-1, i.e., the back gate potential $V_{BG(p)}$ of the diode D3' is rapidly decreased by the parasitic capacitance C5-1. As a result, as illustrated in FIG. 16A, as the back gate potential $V_{BG(p)}$ is decreased from $V_{BG0(p)}$ to $V_{BG2(p)}$, the absolute value of the threshold voltage $V_{thp}$ is also decreased from $V_{thp0}$ to $V_{thp2}$.

In the above-mentioned state, after time t2 as illustrated in FIG. 15, the voltage at the n⁺-type well 53-1, i.e., the back gate potential $V_{BG(p)}$ is slowly increased by the CR time constant circuit formed by the parasitic diode PD2 and the parasitic capacitance C6. Thus, the back gate potential $V_{BG(p)}$ is maintained at a low level for a long time from time t2 to time t3. As a result, as illustrated in FIG. 16B where $V_G$ is a gate voltage of the diode D3' and $I_D$ is a drain current of the diode D3', the ON resistance can be decreased and the diode D3' can be surely maintained at an ON state.

Thus, when the voltage at the ground terminal GND2 is rapidly decreased, the absolute value of the threshold voltage of the diode D3' is increased by the decreased back gate potential $V_{BG(p)}$ as illustrated in FIG. 15, to decrease the ON resistance of the diode D3'. In this case, the n-channel MOS transistor $Q_{n1}$ of the output buffer of the circuit block 1 of FIG. 10 is unstable so that the n-channel MOS transistor $Q_{n1}$ would be turned ON. In this case, a large difference in potential would be generated between the gate and source of the p-channel MOS transistor $Q_{p2}$ of the input buffer of the circuit block 2 of FIG. 10. If such a large difference in potential exceeds the breakdown voltage of the gate insulating layer of the p-channel NOS transistor $Q_{p2}$, the p-channel MOS transistor $Q_{p2}$ would be broken, which would invite a malfunction of the circuit block 2. On the other hand, if an electrostatic discharge current flows from the ground terminal GND2 via the ESD protection circuit 4, the power supply terminal VDD2 and the diode D3' to the power supply terminal VDD1, a gate-to-source voltage of the p-channel MOS transistor $Q_{p2}$ is represented by a sum of a clamp voltage of the ESD protection circuit 3, a product of the ON resistance of the diode D3' and the electrostatic discharging current and a product of other wiring resistance and the electrostatic discharging current. Therefore, when the absolute value of the threshold voltage of the diode D3' is decreased to decrease the ON resistance thereof, the gate-to-source voltage of the p-channel MOS transistor $Q_{p2}$ can be decreased, so that the breakdown of the p-channel MOS transistor $Q_{p2}$ can be avoided, i.e., the malfunction of the circuit block 2 can be avoided.

Figure 17:
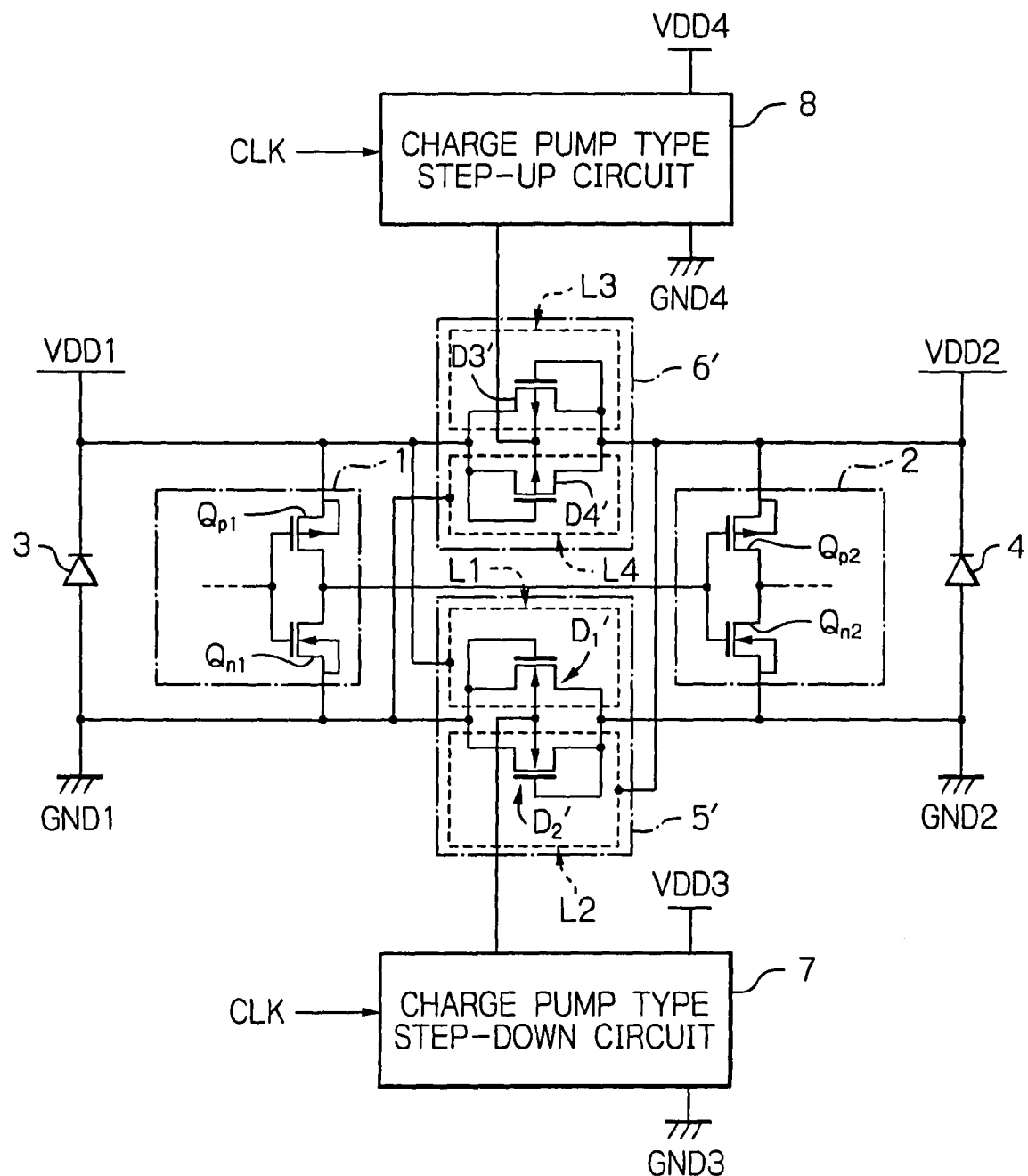
FIG. 17 is a circuit diagram illustrating a third embodiment of the semiconductor device according to the present invention.
Figure 18:
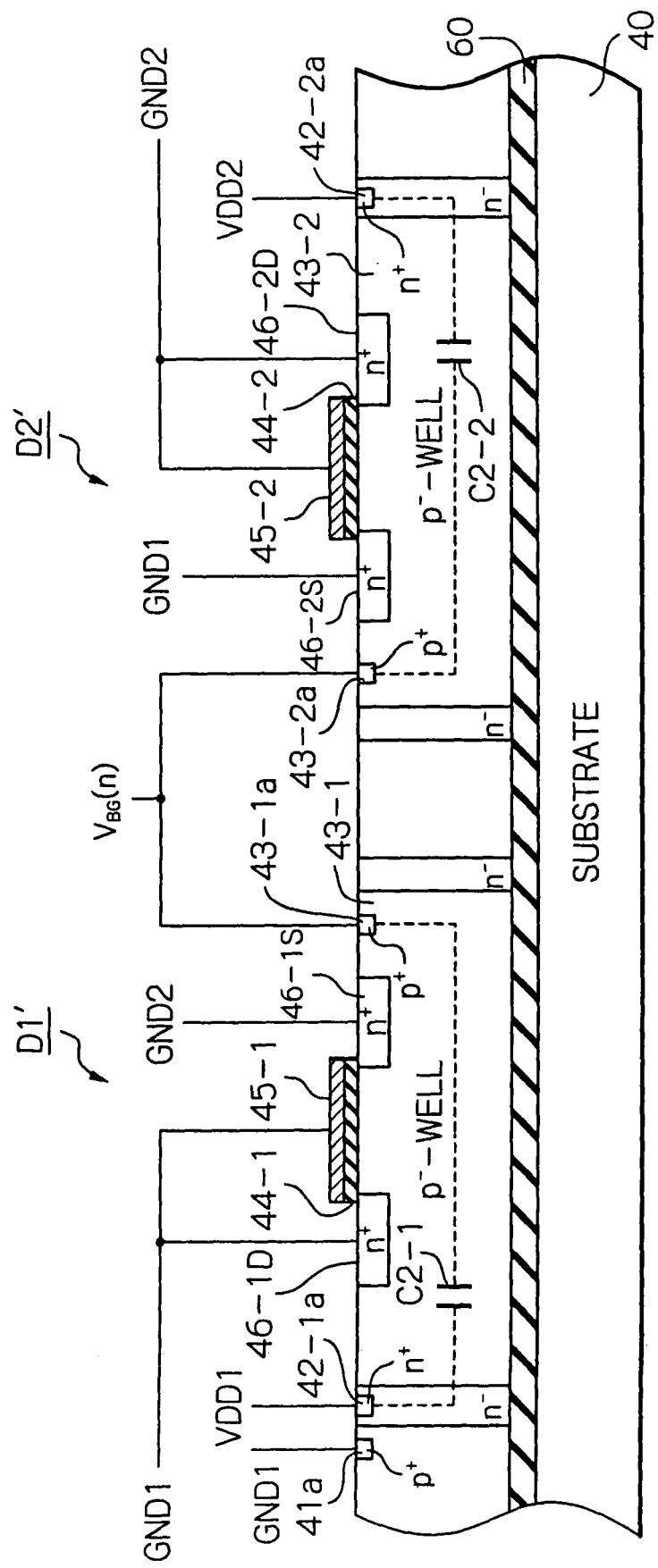
FIG. 18 is a cross-sectional view illustrating a modification of the bi-directional diode circuit of FIG. 4.

In FIG. 17, which illustrates a third embodiment of the semiconductor device according to the present invention, the semiconductor device of FIG. 3 is combined with the semiconductor device of FIG. 10. That is, the bi-directional ESD diode circuits 5' and 6' and the back gate potential adjusting circuits 7 and 8 are provided. As a result, the breakdown of the MOS transistors Qp2 and Qn2 of the input buffer of the circuit blocks 2 can be avoided.

The above-described semiconductor devices of FIGS. 4, 7, 11 and 14 can be of a silicon-on-insulating (SOI) structure. For example, the semiconductor device of FIG. 4 can be modified as illustrated in FIG. 17. In FIG. 17, a silicon dioxide layer 60 is provided to keep the mechanical strength of the silicon substrate 40, which would make the semiconductor thinner.

The invention claimed is:

1. A semiconductor device comprising:
   a first circuit block powered by voltages at first and second power supply terminals;
   a second circuit block powered by voltages at third and fourth power supply terminals, the voltages at said first and third power supply terminals having a same voltage level as each other, the voltages at said second and fourth power supply terminals having a same voltage level as each other;
   a first ESD (electrostatic discharge) protection circuit including a first field effect transistor having a source, a drain, and a gate, where the gate and one of the source and the drain are connected to said first power supply terminal, the other of the source and the drain is connected to said third power supply terminal; and
   a first back gate potential adjusting circuit adapted to adjust a potential at a back gate of said first field effect transistor,
   wherein said first back gate potential adjusting circuit is adapted to make an absolute value of a threshold voltage of said first field effect transistor larger in a usual operation mode than in an ESD protection mode.

2. The semiconductor device as set forth in claim 1, wherein said first field effect transistor comprises a first conductivity type transistor formed in a first well of a second conductivity type serving as the back gate of said first field effect transistor.

3. The semiconductor device as set forth in claim 2, wherein said first well is surrounded by a second well of the first conductivity type connected to said first power supply terminal.

4. The semiconductor device as set forth in claim 3, wherein said first well has a bottom in direct contact with an insulating layer.

5. The semiconductor device as set forth in claim 3, wherein said first back gate potential adjusting circuit comprises a first charge pump circuit connected to said first well, so that a parasitic capacitance between said first and second wells serves as a smoothing capacitor of said first charge pump circuit.

6. The semiconductor device as set forth in claim 5, wherein said first conductivity type comprises an n-type and said second conductivity type comprises a p-type, said first charge pump circuit comprising a charge pump circuit step-down circuit.

7. The semiconductor device as set forth in claim 5, wherein said first conductivity type comprises a p-type and said second conductivity type comprises an n-type, said first charge pump circuit comprising a charge pump circuit step-up circuit.

8. The semiconductor device as set forth in claim 5, wherein said first ESD protection circuit further includes a second field effect transistor having a source, a drain, and a gate, where the gate and one of the source and the drain are connected to said third power supply terminal, the other of the source and the drain is connected to said first power supply terminal,
   said first back gate potential adjusting circuit being further adapted to adjust a potential at a back gate of said second field effect transistor.

9. The semiconductor device as set forth in claim 8, wherein said second field effect transistor comprises a first conductivity type transistor formed in a third well of a second conductivity type serving as the back gate of said second field effect transistor.

10. The semiconductor device as set forth in claim 9, wherein said third well is surrounded by a fourth well of the first conductivity type connected to said fourth power supply terminal.

11. The semiconductor device as set forth in claim 10, wherein said third well has a bottom in direct contact with an insulating layer.

12. The semiconductor device as set forth in claim 10, wherein said first charge pump circuit connected to said third well, so that a parasitic capacitance between said third and fourth wells serves as a smoothing capacitor of said first charge pump circuit.

13. The semiconductor device as set forth in claim 1, further comprising:
   a second ESD protection circuit including a second field effect transistor having a source, a drain, and a gate, where the gate and one of the source and the drain are connected to said fourth power supply terminal, the other of the source and the drain is connected to said second power supply terminal; and
   a second back gate potential adjusting circuit adapted to adjust a potential at a back gate of said third field effect transistor.

14. The semiconductor device as set forth in claim 13, wherein said second back gate potential adjusting circuit is adapted to make an absolute value of a threshold voltage of said third field effect transistor larger in a usual operation mode than in an ESD protection mode.

15. The semiconductor device as set forth in claim 13, wherein said third field effect transistor comprises the second conductivity type transistor formed in a fifth well of a first conductivity type serving as the back gate of said third field effect transistor.

16. The semiconductor device as set forth in claim 15, wherein said fifth well is surrounded by a sixth well of the second conductivity type connected to said second power supply terminal.

17. The semiconductor device as set forth in claim 16, wherein said fifth well has a bottom in direct contact with an insulating layer.

18. The semiconductor device as set forth in claim 16, wherein said second back gate potential adjusting circuit comprises a second charge pump circuit connected to said fifth well, so that a parasitic capacitance between said fifth and sixth wells serves as a smoothing capacitor of said second charge pump circuit.

19. The semiconductor device as set forth in claim 18, wherein said first conductivity type comprises an n-type transistor and said second conductivity type comprises a p-type transistor, said second charge pump circuit comprising a charge pump type step-down circuit.

20. The semiconductor device as set forth in claim 18, wherein said first conductivity type comprises a p-type transistor and said second conductivity type comprises an n-type transistor, said second charge pump circuit comprising a charge pump type step-up circuit.

21. The semiconductor device as set forth in claim 18, wherein said second ESD protection circuit further includes a fourth field effect transistor having a source, a drain, and a gate, where the gate and one of the source and the drain are connected to said second power supply terminal, the other of the source and the drain is connected to said fourth power supply terminal, said second back gate potential adjusting circuit being further adapted to adjust a potential at a back gate of said fourth field effect transistor.

22. The semiconductor device as set forth in claim 21, wherein said fourth field effect transistor comprises the second conductivity type transistor formed in a seventh well of the first conductivity type serving as the back gate of said third field effect transistor.

23. The semiconductor device as set forth in claim 22, wherein said seventh well is surrounded by an eighth well of the second conductivity type connected to said fourth power supply terminal.

24. The semiconductor device as set forth in claim 23, wherein said eighth well has a bottom in direct contact with an insulating layer.

25. The semiconductor device as set forth in claim 23, wherein said second charge pump circuit is connected to said seventh well, so that a parasitic capacitance between said seventh and eighth wells serves as a smoothing capacitor of said second charge pump circuit.

* * * * *

UNITED STATES PATENT AND TRADEMARK OFFICE
CERTIFICATE OF CORRECTION

| | | |
|---|---|---|
| PATENT NO. | : 7,817,385 B2 | Page 1 of 1 |
| APPLICATION NO. | : 11/806270 | |
| DATED | : October 19, 2010 | |
| INVENTOR(S) | : Toshikatsu Kawachi | |

It is certified that error appears in the above-identified patent and that said Letters Patent is hereby corrected as shown below:

In particular, it is requested that claims 3, 13, 16, and 23 be corrected as follows:

claim 3, at column 11, line 66
change "said first power" to --said second power--;

claim 13, column 12, line 49
change "including a second" to --including a third--;

claim 16, at column 13, line 3
change "connected to said second power" to --connected to said third power--; and claim 23, at column 14, line 15
change "connected to said fourth power" to --connected to said first power--.

Signed and Sealed this
Nineteenth Day of April, 2011

David J. Kappos
*Director of the United States Patent and Trademark Office*